(12) United States Patent
Takatani et al.

(10) Patent No.: US 11,489,050 B2
(45) Date of Patent: Nov. 1, 2022

(54) VERTICAL NITRIDE SEMICONDUCTOR TRANSISTOR DEVICE

(71) Applicants: Shinichiro Takatani, Tokyo (JP); Riichiro Shirota, Hsinchu (TW)

(72) Inventors: Shinichiro Takatani, Tokyo (JP); Riichiro Shirota, Hsinchu (TW)

( * ) Notice: Subject to any disclaimer, the term of this patent is extended or adjusted under 35 U.S.C. 154(b) by 26 days.

(21) Appl. No.: 17/143,144

(22) Filed: Jan. 6, 2021

(65) Prior Publication Data

US 2021/0226019 A1    Jul. 22, 2021

(30) Foreign Application Priority Data

Jan. 16, 2020    (JP) .............................. JP2020-005312

(51) Int. Cl.
*H01L 29/40*    (2006.01)
*H01L 29/778*    (2006.01)
(Continued)

(52) U.S. Cl.
CPC ........ *H01L 29/408* (2013.01); *H01L 29/0696* (2013.01); *H01L 29/42324* (2013.01);
(Continued)

(58) Field of Classification Search
CPC ... H01L 29/408; H01L 29/517; H01L 29/518; H01L 29/2003; H01L 29/7788; H01L 29/802; H01L 29/792
See application file for complete search history.

(56) References Cited

U.S. PATENT DOCUMENTS 9,590,088 B2    3/2017  Chowdhury et al.
2012/0146728 A1*  6/2012  Makiyama .......... H01L 29/7787
                                                257/E21.409
(Continued)

FOREIGN PATENT DOCUMENTS

TW    200849494    12/2008
TW    201438320    10/2014

OTHER PUBLICATIONS

Dong Ji, et al., "880 V/ 2.7 mΩ·cm 2 MIS Gate Trench CAVET on Bulk GaN Substrates", IEEE Electron Device Letters, vol. 39, No. 6, Apr. 20, 2018, pp. 863-865.
(Continued)

*Primary Examiner* — Fernando L Toledo
*Assistant Examiner* — Valerie N Newton
(74) *Attorney, Agent, or Firm* — JCIPRNET

(57) ABSTRACT

A normally-off vertical nitride semiconductor transistor device with low threshold voltage variation includes a drift layer containing a nitride semiconductor, a channel region electrically connected to the drift layer, a source electrode, a drain electrode, a gate insulating film, and a gate electrode. The gate insulating film includes at least a first insulating film located at the channel region side, a second insulating film located at the gate electrode side, and a third insulating film between the second insulating film and the gate electrode, wherein the second insulating film has charge traps with energy levels located inside the band gaps of both the first and third insulating films, and the threshold voltage is adjusted by charges accumulated in the charge traps. The threshold voltage is used to block flowing current by substantially eliminating conduction carriers of the channel region by voltage applied to the gate electrode.

20 Claims, 20 Drawing Sheets

(51) Int. Cl.
*H01L 29/06* (2006.01)
*H01L 29/423* (2006.01)
*H01L 29/51* (2006.01)
*H01L 29/205* (2006.01)
*H01L 29/20* (2006.01)

(52) U.S. Cl.
CPC ...... *H01L 29/7788* (2013.01); *H01L 29/2003* (2013.01); *H01L 29/205* (2013.01); *H01L 29/513* (2013.01); *H01L 29/517* (2013.01); *H01L 29/518* (2013.01); *H01L 29/7786* (2013.01)

(56) References Cited

U.S. PATENT DOCUMENTS

2017/0125574 A1* 5/2017 Chowdhury ........ H01L 29/7787
2019/0296157 A1 9/2019 Zhu et al.
2019/0334024 A1 10/2019 Jiang

OTHER PUBLICATIONS

Daisuke Shibata, et al., "1.7 kV/1.0 mΩcm2 normally-off vertical GaN transistor on GaN substrate with regrown p-GaN/AlGaN/GaN semipolar gate structure", IEEE International Electron Devices Meeting (IEDM), Feb. 2, 2017, pp. 10.1.1-10.1.4.

Ray Li, et al., "600V/1.7Ω Normally-Off GaN Vertical Trench Metal-Oxide-Semiconductor Field-Effect Transistor", IEEE Electron Device Letters, vol. 37, No. 11, Nov. 2016, pp. 1466-1469.

Chirag Gupta, et al., "In Situ Oxide, GaN Interlayer-Based Vertical Trench MOSFET (OG-FET) on Bulk GaN substrates", IEEE Electron Device Letters, vol. 38, No. 3, Mar. 2017, pp. 353-355.

"Office Action of Taiwan Counterpart Application", dated Mar. 9, 2022, p. 1-p. 3.

* cited by examiner

| Structure type | | Reference numeral | Name | Dimension type | Dimension (μm) | Material | Dopant concentration (cm$^{-3}$) | Remarks |
|---|---|---|---|---|---|---|---|---|
| Layer structure | | 101 | Drift layer | Thickness | 2 | n-type GaN layer | $1 \times 10^{16}$ | |
| | | 102 | Barrier layer | | 0.4 | p-type GaN layer | $1 \times 10^{17}$ | |
| | | 104 | First nitride semiconductor layer | | 0.2 | GaN layer | $1 \times 10^{16}$ | The dimension is of the part on the p-type GaN layer |
| | | 105 | Second nitride semiconductor layer | | 0.01 | AlGaN layer | 0 | AlN mixed crystal ratio=0.3 |
| | | 106 | First insulating layer | | 0.01 | Silicon oxide | , | |
| | | 107 | Second insulating layer | | 0.01 | Silicon nitride | , | |
| | | 108 | Third insulating layer | | 0.01 | Silicon oxide | , | |
| Layout | | 118 | a | Opening (103) width | 2 | | , | |
| | | 119 | b | Channel region width | 1 | | , | |
| | | 120 | c | Distance between gate and source | 1 | | , | |

FIG. 2

US 11,489,050 B2

VERTICAL NITRIDE SEMICONDUCTOR TRANSISTOR DEVICE

CROSS-REFERENCE TO RELATED APPLICATION

This application claims the priority benefit of Japanese Application Serial No. 2020-005312, filed on Jan. 16, 2020. The entirety of the above-mentioned patent applications is hereby incorporated by reference herein and made a part of this specification.

BACKGROUND OF THE INVENTION

Field of the Invention

The invention relates to a vertical nitride semiconductor transistor device, and in particular relates to a vertical nitride semiconductor field-effect transistor device having a field-effect gate and suitable for high-power switching elements.

Description of Related Art

Semiconductors containing GaN, AlN, InN, or mixed crystals thereof, which are used as nitride semiconductors, have a wide band gap, and the conduction electrons have high carrier mobility, so such semiconductors are suitable for high-voltage and high-output power electronic elements. Particularly in a vertical field-effect transistor made using a nitride semiconductor, the electron current flowing out from the source flows into the drain through a thick drift layer with low dopant concentration disposed at the lower part of the source region. Therefore, the withstand voltage for the drain voltage in the off-state is high. Moreover, since the source and the drain are arranged vertically, the current flowing per unit area is high and the on-resistance per unit area is low. Therefore, vertical field-effect transistors are suitable for use as high-power switch elements. FIG. 17(a) is a cross-sectional view of a vertical nitride semiconductor field-effect transistor as the first current approach (Patent literature 1). First, a drift layer 1101 is formed on a substrate 1100. N-type GaN, SiC, Si, etc. are used for the substrate 1100. The epitaxial growth of nitride semiconductors in the c-axis direction can easily achieve good crystallinity. Therefore, the substrate 1100 is preferably a single-crystal substrate having a crystal plane orientation that allows epitaxial growth in the c-axis direction. For example, in the case of using a GaN substrate or a SiC substrate having a hexagonal crystal structure, the crystal plane orientation of the substrate is set to the c-axis direction. In the case of using a GaN substrate, a Ga-plane substrate that is particularly easy to grow epitaxial crystals on is used. In addition, in the case of using a Si substrate, if a substrate having the crystal plane orientation (111) is used, epitaxial growth of the nitride semiconductor in the c-axis direction may be achieved. Between the substrate 1100 and the drift layer 1101, a buffer layer may be inserted for the purpose of improving the crystallinity during epitaxial growth of the drift layer 1101. The drift layer 1101 may adopt n-type GaN, n-type AlGaN, or AlGaN with a composition gradient, or the like. A barrier layer 1102, a first nitride semiconductor layer 1104, and a second nitride semiconductor layer 1105 are disposed at the upper part of the drift layer 1101. The barrier layer 1102 is provided for the purpose of preventing the flow of conduction electrons, and an opening 1103 that does not block the flow of conduction electrons is disposed in a part in the plane. There are various methods for making the opening 1103. For example, the barrier layer 1102 may be formed on the entire surface of the drift layer 1101, and the barrier layer 1102 of the opening 1103 may be removed by wet etching or dry etching. Then, the first nitride semiconductor layer 1104 and the second nitride semiconductor layer 1105 are grown to fill the opening 1103. In this case, for the barrier layer 1102, p-type GaN, p-type AlGaN, a high-resistance nitride semiconductor doped with a dopant for forming deep trap energy levels, an insulating film, or a laminated structure thereof, etc. grown epitaxially on the drift layer 1101 is used. Alternatively, after the drift layer 1101 is grown, a p-type dopant may be selectively introduced to parts other than the opening by ion implantation and activated by subsequent heat treatment, thereby forming the barrier layer 1102 including a p-type layer. Alternatively, after the drift layer 1101, the barrier layer 1102 containing a p-type nitride semiconductor, the first nitride semiconductor layer 1104, and the second nitride semiconductor layer 1105 are epitaxially grown sequentially, an n-type dopant is selectively ion-implanted into the opening 1103 and activated by subsequent heat treatment, so that the barrier layer 1102 of the opening 1103 undergoes n-type inversion. The second nitride semiconductor layer 1105 contains at least a nitride semiconductor having a band gap larger than at least a part of the nitride semiconductor of the first nitride semiconductor layer 1104. For example, GaN is used as the first nitride semiconductor layer 1104, and AlGaN is used as the second nitride semiconductor layer 1105. Thus, a conduction layer 1111 and a conduction layer 1112 containing two-dimensional electron gas are formed at the first nitride semiconductor layer 1104 side of the interface between the second nitride semiconductor layer 1105 and the first nitride semiconductor layer 1104. A gate insulating film 1106 is formed on the second nitride semiconductor layer 1105. As the material thereof, aluminum oxide, silicon oxide, silicon nitride, hafnium oxide, zirconium oxide, or other conventionally known gate insulator materials, or laminated films thereof are used. A gate electrode 1107 is formed on the gate insulating film 1106. In addition, a source electrode 1109 is formed to be in contact with the second nitride semiconductor layer 1105, and a drain electrode 1110 is formed on the back surface of the substrate 1100. In addition, when a p-type nitride semiconductor is used in the barrier layer 1102, a body electrode 1108 may be provided in order to fix the potential. Pd, Pt, or Ni is used as the electrode material, for example. The source electrode 1109 is formed to be electrically connected to the body electrode 1108 at the same time. As the electrode material, a multilayer film formed by a Ti lower layer and an Al upper layer is used, for example. In addition, the source electrode 1109 may also be formed before the gate electrode 1107 is formed. For example, after the second nitride semiconductor layer 1105 is formed, the body electrode 1108 and the source electrode 1109 are formed first, then the gate insulating film 1106 is deposited, and then the gate electrode 1107 is formed. The drain electrode 1110 of the back surface may also be formed before other electrodes are formed. The body electrode 1108 is provided to fix the potential of the barrier layer 1102, but the body electrode 1108 may also be omitted.

Next, the working principle of the vertical nitride semiconductor transistor shown in FIG. 17(a) as the first current approach is described. Due to the presence of the barrier layer 1102, conduction electrons flowing into the semiconductor layer from the source electrode 1109 do not flow directly toward the substrate direction, but instead pass through a part of the conduction layer 1112 (represented by the thin dashed line in FIG. 17(a)) and the conduction layer 1111 (represented by the thick dashed line in FIG. 17(a)), and flow into the drift layer 1101 through the opening 1103 in the direction of an arrow 1113 indicating the flow of conduction electrons. Then, the conduction electrons pass through the drift layer 1101 and the substrate 1100 to reach the drain electrode 1110. At this time, the number of conduction electrons of the conduction layer 1111 directly below the gate electrode 1107 may be changed using the field effect of the voltage applied to the gate electrode 1107, thereby changing the flow of electrons. Hereinafter, the conduction region in which the number of conduction electrons may be changed using the field effect of the gate electrode in the current path between the source and the drain is referred to as a channel region. In FIG. 17(a), the channel region 1114 is indicated by a dotted ellipse. The gate voltage that substantially eliminates the conduction electrons in the conduction layer 1111 forming the channel region 1114 to block the current is called the threshold voltage. In the vertical nitride semiconductor field-effect transistor shown in the present approaches, the threshold voltage is usually a negative value. By applying a voltage at the threshold voltage or above to the gate electrode, the switching element is turned on. At this point, the conduction electrons reach the opening 1103 through the conduction layer 1112 and the conduction layer 1111 in the channel region, both containing two-dimensional electron gas having high mobility. Therefore, a switching element with low resistance in the on state, that is, low on-resistance, may be obtained. Moreover, for a high-power switch in the off state, the withstand voltage relative to the drain voltage is important. In a vertical transistor, the withstand voltage may be increased by increasing the thickness of the drift layer 1101 and reducing the n-type dopant concentration of the drift layer 1101. However, the resistance of conduction electrons passing through the drift layer is increased, so on-resistance is increased. Therefore, the withstand voltage and the on-resistance need to be considered to optimize the thickness and dopant concentration of the drift layer 1101.

FIG. 17(b) is a cross-sectional view of a vertical nitride semiconductor transistor as the second current approach. In the second current approach, an n-type nitride semiconductor layer 1130 is disposed between the drift layer 1101 and the substrate 1100, and the drain electrode 1110 is disposed at the upper surface of the n-type nitride semiconductor layer 1130 to be in contact with the n-type nitride semiconductor layer 1130 instead of being disposed at the back surface of the substrate 1100. Therefore, the substrate 1100 does not need to be an n-type substrate, and a high-resistance substrate may also be used. The rest is the same as the first current approach shown in FIG. 17(a). In the second current approach, since the drain electrode 1110 is present at the surface, an additional area is needed when manufacturing the switching elements. Compared with the first current approach, the on-resistance per unit area is higher. Hereinafter, both the current approaches and the embodiments of the invention only describe the case in which the drain electrode is disposed on the back surface of the substrate.

FIG. 18 is a cross-sectional structure of a vertical nitride semiconductor transistor as the third current approach (Non-patent literature 1). The drift layer 1101 is formed on the substrate 1100, and then a barrier layer 1202 is formed thereon. The manufacturing process up to this point is substantially the same as that of the transistor described in FIG. 17(a), but an opening 1203 is formed by removing unnecessary parts by etching after the barrier layer 1202 is formed on the entire surface. The opening has an incline as shown in FIG. 18. Then, a first nitride semiconductor layer 1204 and a second nitride semiconductor layer 1205 are grown along the side surface of the opening having the incline. Here, the second nitride semiconductor layer 1205 includes at least a nitride semiconductor having a band gap larger than at least a part of the nitride semiconductor of the first nitride semiconductor layer 1204, which is the same as the first current approach described in FIG. 17(a). For example, GaN is used as the first nitride semiconductor layer 1204, and AlGaN is used as the second nitride semiconductor layer 1205. In particular, since the first nitride semiconductor layer 1204 and the second nitride semiconductor layer 1205 grow along the side surface of the opening 1203, the conduction layer 1211 formed at the first nitride semiconductor layer 1204 side of the interface between the second nitride semiconductor layer 1205 and the first nitride semiconductor layer 1204 is also formed along the inner side of the opening 1203 containing the side surface. Then, a gate insulating film 1206 is formed, and a gate electrode 1207 is formed thereon to cover the inner surface of the opening. The body electrode 1108, the source electrode 1109, and the drain electrode 1110 are formed in the same manner as in the first current approach described in FIG. 17(a).

Next, the working principle of the vertical nitride semiconductor transistor shown in FIG. 18 as the third current approach is described. The channel region 1214 includes a part of the conduction layer 1211 formed at the inclined part in the opening 1203. Conduction electrons flow from the source electrode 1109 through a conduction layer 1212 and a channel region 1214 and flow into the drift layer 1101, and then pass through the substrate 1100 to reach the drain electrode 1110. In addition, the number of conduction electrons including in the conduction layer 1211 within the channel region 1214 may be altered via the field effect of the voltage applied to the gate electrode 1207, thereby adjusting the amount of current. The threshold voltage for substantially eliminating the conduction electrons in the channel region 1214 to block the current may be set to a voltage less negative than that of the current approach of FIG. 17(a) or a positive voltage. This is based on the following reasons. As explained in the second paragraph in Description of Related Art, in the first current approach of FIG. 17(a), the crystal plane orientation of the nitride semiconductor layer grown on the substrate is the c-axis direction. The c-plane is a so-called polarization plane, and the conduction layer 1111 is spontaneously formed under the influence of spontaneous polarization and piezoelectric polarization occurring in the substrate direction along the c-axis, when no external voltage is applied. Therefore, in order to substantially eliminate the conduction electrons of the conduction layer 1111, a large negative voltage needs to be applied to the gate electrode 1107. That is, the threshold voltage has a large negative value. In contrast, in the third current approach shown in FIG. 18, the crystal plane orientations of the first semiconductor layer 1204 and the second semiconductor layer 1205 formed on the side surface of the opening 1203 are deviated from the c-axis direction. Therefore, spontaneous polarization and piezoelectric polarization are weakened, and when no external voltage is applied, the number of carriers induced in the conduction layer 1211 formed at the side surface is less than that of the conduction layer 1111 of FIG. 17(a). This is the reason that the threshold voltage is shifted in the positive direction compared with the first current approach of FIG. 17(a) (Non-patent literature 2). However, the shift amount of the threshold voltage sensitively depends on the inclination angle of the side surface. The threshold voltage also largely depends on the details of the forming process of the opening 1203, the first nitride semiconductor layer 1204, the second nitride semiconductor layer 1205, and the gate insulating film 1206. Therefore, a threshold voltage having a negative large value is also reported (Non-patent literature 1).

FIG. 19 is a cross-sectional structure of a vertical nitride semiconductor transistor as the fourth current approach (Non-patent literature 3). Until the drift layer 1301 is grown on the substrate 1300, the manufacturing process is substantially the same as that of the substrate 1100 and the drift layer 1101 of the first current approach described in FIG. 17(a). Then, a p-type nitride semiconductor layer 1302 and an n-type nitride semiconductor layer 1303 are sequentially formed. The p-type nitride semiconductor layer 1302 is used as a p-type body region. In a preferred example, GaN is used in the p-type nitride semiconductor layer 1302 and the n-type nitride semiconductor layer 1303. After the n-type nitride semiconductor layer 1303 is formed, a trench 1304 penetrating to the drift layer 1301 is formed by wet etching or dry etching. Then, a gate insulating film 1305 is formed to cover the side and bottom surfaces of the trench 1304. In addition, in order to improve the characteristics of the interface between the gate insulating film and the nitride semiconductor, before the gate insulating film 1305 is formed, a thin nitride semiconductor layer such as GaN may also be grown to cover the inner wall of the trench 1304 (Non-patent literature 4). Then, a gate electrode 1306 is formed to cover the inner surface of the trench 1304. Then, a body electrode 1307 electrically connected to the p-type nitride semiconductor layer 1302 is formed. Pd, Pt, or Ni is used as the electrode material, for example. Then, a source electrode 1308 is formed. As the electrode material, a multilayer film formed by a Ti lower layer and an Al upper layer is used, for example. The source electrode 1308 is electrically connected to the body electrode 1307 and the n-type nitride semiconductor layer 1303. Then, a drain electrode 1309 is formed on the back surface of the substrate 1300, thus completing the vertical nitride semiconductor transistor. The body electrode 1307 and the source electrode 1308 may be formed before the gate electrode 1306 is formed. For example, after the n-type nitride semiconductor layer 1303 is formed, the body electrode 1307 and the source electrode 1308 are formed first, and then the trench 1304 is formed, the gate insulating film 1305 is deposited, and the gate electrode 1306 is formed, in that order. The drain electrode 1309 of the back surface may also be formed before other electrodes are formed. The body electrode 1307 is provided to fix the potential of the p-type nitride semiconductor layer 1302 used as the p-type body region, and may also be omitted.

Next, the working principle of the vertical nitride semiconductor transistor shown in FIG. 19 as the fourth current approach is described. Due to the presence of the p-type nitride semiconductor layer 1302, conduction electrons flowing into the n-type nitride semiconductor layer 1303 from the source electrode 1308 do not directly flow in the direction of the substrate, but instead flow toward the direction of the trench 1304 along an arrow 1311 indicating the flow of conduction electrons. Moreover, the p-type nitride semiconductor layer 1302 functions as a p-type body region, and the inverted conduction layer 1310 formed along the side surface inside the trench 1304 forms the channel region 1314. Conduction electrons flow from the n-type nitride semiconductor layer 1303 to the drift layer 1301 through the channel region 1314 and along an arrow 1312 indicating the flow of electrons. Then, the conduction electrons pass through the drift layer 1301 and the substrate 1300 to reach the drain electrode 1309. The design of the drift layer 1301 may be the same as described in the first current approach of FIG. 17(a). The number of conduction electrons induced in the conduction layer 1310 forming the channel region may be changed using the voltage applied to the gate electrode 1306. When the gate voltage is at a certain threshold voltage or less, the gate voltage is in the off state, and when the gate voltage is at the threshold voltage or above, the gate voltage is in the on state, and therefore an on/off operation as a switch may be achieved. In the on state, the mobility of conduction electrons flowing in the conduction layer 1310 is reduced due to influence such as irregularities or defects at the interface between the conduction layer 1310 and the gate insulating film 1305. Therefore, compared with the first current approach of FIG. 17(a), the current is lower and the on-resistance is higher. Moreover, the conduction layer 1310 is formed as a surface substantially orthogonal to the c-plane, so the influence of polarization is small. Unlike the first current approach of FIG. 17(a), the threshold voltage is usually a positive value.

EXISTING TECHNICAL LITERATURE

Patent Literature

[Patent literature 1] Chowdhury et al., U.S. Pat. No. 9,590,088 B2

Non-Patent Literature

[Non-patent literature 1] Dong Ji et al., Institute of Electrical and Electronics Engineers (IEEE), Electron Device Letters, Vol. 39, No. 6, June 2018, p. 863.
[Non-patent literature 2] Daisuke Shibata et al., International Electron Device Meeting, 2016, p. 248.
[Non-patent literature 3] Ray Li et al., Institute of Electrical and Electronics Engineers (IEEE), Electron Device Letters, Vol. 37, No. 11, November 2016, p. 1466.
[Non-patent literature 4] Chirag Gupta et al., Institute of Electrical and Electronics Engineers (IEEE), Electron Device Letters, Vol. 38, No. 3, March 2017, p. 353.

SUMMARY OF THE INVENTION

Issue to be Solved by the Invention

The threshold voltages of the vertical nitride semiconductor transistors of the first current approach and the second current approach are usually negative voltages. That is, the switching element is so-called normally on where the switch is turned on when no voltage is applied to the gate electrode. A switch formed by a normally-on transistor turns on when the control voltage applied to the gate electrode is lost due to, for example, misoperation or malfunction. Therefore, there is a high risk of damage to the device such as a power supply as a whole, which is not preferable from the viewpoint of safety. Regarding the threshold voltage of the vertical nitride semiconductor transistor of the third current approach, since the crystal plane orientation of the nitride semiconductor layer in the channel part is inclined from the c-axis, the influence of polarized charges is reduced, and the threshold voltage is expected to be shifted toward the direction of the positive voltage. However, the actual threshold voltage depends to a large extent on the structure or manufacturing process, and in most cases is a negative voltage. Or, even in the case where the threshold voltage is a positive voltage and is normally off, it is still difficult to obtain a threshold voltage of 3 V or more that is generally desired from the viewpoint of safety in applications such as power supplies. In addition, the threshold voltage varies greatly due to the manufacturing process, and switching elements with consistent characteristics are difficult to obtain. In the vertical nitride semiconductor transistor of the fourth current approach, a normally-off transistor with a positive voltage of about 3 V may be obtained. However, since an inverted conduction layer 1310 forming the channel is formed at the side surface of an opening 1304 that is formed by etching, reasons such as residual damage of the semiconductor surface caused by etching make it difficult to form a good-quality gate insulating film 1305 at the side surface inside the opening 1304. Threshold voltage varies greatly due to the manufacturing process, and switching elements with consistent characteristics are difficult to obtain.

An objective of the invention is to provide a normally-off vertical nitride semiconductor transistor having a sufficiently large positive voltage and a threshold voltage with low variation.

Technical Means for Solving the Issue

The vertical nitride semiconductor transistor device provided by the first invention of the present application for solving the issue includes: a drift layer formed by a nitride semiconductor; a channel region formed by a nitride semiconductor and electrically connected to the drift layer; a source electrode electrically in contact with a side of the channel region opposite to the drift layer; a drain electrode in electrical contact with the drift layer; a gate insulating film adjacent to the channel region; and a gate electrode disposed at a side of the gate insulating film opposite to the channel region. The gate insulating film includes at least a first insulating film located at the channel region side, a second insulating film closer to the gate electrode side than the first insulating film, and a third insulating film closer to the gate electrode side than the second insulating film. The second insulating film has charge traps with energy levels located inside band gaps of both the first insulating film and the third insulating film. A threshold voltage is adjusted by charges accumulated in the charge traps, and the threshold voltage is used to substantially eliminate conduction carriers of the channel region using a voltage applied to the gate electrode to block a current flowing between the source electrode and the drain electrode.

In a preferred embodiment of the vertical nitride semiconductor transistor device provided by the first invention of the present application, the threshold voltage is adjusted to a positive voltage by the charges accumulated in the charge traps.

In a preferred embodiment of the vertical nitride semiconductor transistor device provided by the first invention of the present application, a barrier layer that blocks the current is disposed on the drift layer, a first nitride semiconductor layer is disposed on the barrier layer, and a second nitride semiconductor layer is disposed on the first nitride semiconductor layer. The second nitride semiconductor layer contains at least a nitride semiconductor having a band gap larger than at least a part of a nitride semiconductor of the first nitride semiconductor layer. The channel region includes at least a part of a conduction layer formed at the first nitride semiconductor layer side of an interface between the second nitride semiconductor layer and the first nitride semiconductor layer. The barrier layer has an opening. The first nitride semiconductor layer is electrically connected to the drift layer through the opening. The current between the source electrode and the drain electrode substantially flows through the opening.

In another preferred embodiment of the vertical nitride semiconductor transistor device provided by the first invention of the present application, a third nitride semiconductor layer having a conductivity type opposite to that of the drift layer is disposed on the drift layer, a fourth nitride semiconductor layer is disposed on the third nitride semiconductor layer, and the fourth nitride semiconductor layer has substantially the same conductivity type as the drift layer through dopant doping or polarized charges. The source electrode is electrically connected to the fourth nitride semiconductor layer. A trench that penetrates the fourth nitride semiconductor layer and the third nitride semiconductor layer to reach the drift layer is formed. At least a part of the gate insulating film is formed at a side surface of the third nitride semiconductor layer in an inner surface of the trench directly or with a thin nitride semiconductor layer in between. At an interface formed directly between the side surface of the third nitride semiconductor layer and the gate insulating film or with the thin nitride semiconductor layer in between, an inverted conduction layer is formed at a side closer to the third nitride semiconductor layer (i.e. the third nitride semiconductor layer side of the interface). At least a part of the gate electrode is formed at a side of the gate insulating film opposite to the inverted conduction layer, and the channel region includes at least a part of the inverted conduction layer.

The vertical nitride semiconductor transistor device provided by the second invention of the present application for solving the issue includes: a drift layer formed by a nitride semiconductor; a channel region formed by a nitride semiconductor and electrically connected to the drift layer; a source electrode electrically in contact with a side of the channel region opposite to the drift layer; a drain electrode in electrical contact with the drift layer; a fourth insulating film adjacent to the channel region; a charge storage electrode disposed at a side of the fourth insulating film opposite to the channel region; a fifth insulating film disposed at a side of the charge storage electrode opposite to the fourth insulating film; and a gate electrode disposed at a side of the fifth insulating film opposite to the charge storage electrode. A threshold voltage is adjusted by charges accumulated in the charge storage electrode, and the threshold voltage is used to substantially eliminate conduction carriers of the channel region using a voltage applied to the gate electrode to block a current flowing between the source electrode and the drain electrode.

In a preferred embodiment of the vertical nitride semiconductor transistor device provided by the second invention of the present application, the charge storage electrode includes a plurality of electrodes arranged laterally and electrically insulated.

In a preferred embodiment of the vertical nitride semiconductor transistor device provided by the second invention of the present application, the threshold voltage is adjusted to a positive voltage by the charges accumulated in the charge storage electrode.

In a preferred embodiment of the vertical nitride semiconductor transistor device provided by the second invention of the present application, in an on state, a capacitance value of a first capacitor formed between the channel region and the charge storage electrode is smaller than a capacitance value of a second capacitor formed between the gate electrode and the charge storage electrode.

In a preferred embodiment of the vertical nitride semiconductor transistor device provided by the second invention of the present application, there is a charge injection electrode forming a third capacitor with the charge storage electrode, and the charges of the charge storage electrode are accumulated by a current flowing through the third capacitor.

In a preferred embodiment of the vertical nitride semiconductor transistor device provided by the second invention of the present application, a sixth insulating film is formed at at least a part on the charge injection electrode, the charge storage electrode is formed at at least a part on the sixth insulating film, and the sixth insulating film is used as a capacitive coupling film to form the third capacitor between the charge storage electrode and the charge injection electrode.

In a preferred embodiment of the vertical nitride semiconductor transistor device provided by the second invention of the present application, a capacitance value of the third capacitor is smaller than a capacitance value of the second capacitor.

In a preferred embodiment of the vertical nitride semiconductor transistor device provided by the second invention of the present application, a barrier layer that prevents the current is disposed on the drift layer, a first nitride semiconductor layer is disposed on the barrier layer, a second nitride semiconductor layer is disposed on the first nitride semiconductor layer, and the second nitride semiconductor layer contains at least a nitride semiconductor having a band gap larger than at least a part of a nitride semiconductor of the first nitride semiconductor layer. The channel region includes at least a part of a conduction layer formed at the first nitride semiconductor layer side of an interface between the second nitride semiconductor layer and the first nitride semiconductor layer. The barrier layer has an opening. The first nitride semiconductor layer is electrically connected to the drift layer through the opening. The current between the source electrode and the drain electrode substantially flows through the opening.

In another preferred embodiment of the vertical nitride semiconductor transistor device provided by the second invention of the present application, a third nitride semiconductor layer having a conductivity type opposite to that of the drift layer is disposed on the drift layer, a fourth nitride semiconductor layer is disposed on the third nitride semiconductor layer, the fourth nitride semiconductor layer has substantially a same conductivity type as the drift layer through dopant doping or polarized charges, and the source electrode is electrically connected to the fourth nitride semiconductor layer. A trench that penetrates the fourth nitride semiconductor layer and the third nitride semiconductor layer to reach the drift layer is formed. At least a part of the fourth insulating film is formed at a side surface of the third nitride semiconductor layer in an inner surface of the trench directly or with a thin nitride semiconductor layer in between. At an interface formed directly between the side surface of the third nitride semiconductor layer and the fourth insulating film or with the thin nitride semiconductor layer in between, an inverted conduction layer is formed at a side closer to the third nitride semiconductor layer (i.e. the third nitride semiconductor layer side of the interface). At least a part of the charge storage electrode is formed at a side of the fourth insulating film opposite to the inverted conduction layer. The channel region includes at least a part of the inverted conduction layer.

In the second invention of the present application, when charges are accumulated in the charge storage electrode by the current flowing through the third capacitor, a voltage is applied to the gate electrode, and the amount of charge injection may be easily controlled.

When the vertical nitride semiconductor transistor device provided by the second invention of the present application is sealed in a package, the gate electrode, the drain electrode, and the source electrode may be connected to external pins respectively, so that the charge injection electrode is not connected to an external pin. Alternatively, the charge injection electrode and the gate electrode may be connected to the same external pin.

In preferred embodiments of the vertical nitride semiconductor transistor devices provided by the first invention and the second invention of the present application, the first nitride semiconductor layer is formed by GaN, and the second nitride semiconductor layer is formed by $Al_xGa_{1-x}N$ ($0<x\leq1$). Since the conduction layer induced in the interface between GaN and $Al_xGa_{1-x}N$ has high electron mobility, a vertical nitride semiconductor transistor device with excellent on-resistance, which is one of the important characteristics of a switch, may be obtained.

In preferred embodiments of the vertical nitride semiconductor transistor devices provided by the first invention and the second invention of the present application, at least the lowermost layer of the gate insulating film in contact with the nitride semiconductor layer is formed by aluminum oxide. Aluminum oxide does not readily produce interface trap energy levels in the interface with the nitride semiconductor layer. Therefore, when a positive voltage is applied to the gate electrode to increase the number of conduction carriers of the channel region to increase flowing current, it is less likely to be affected by the interface trap energy levels in the interface between the nitride semiconductor of the channel region and the gate insulating film. As a result, a vertical nitride semiconductor transistor device with excellent on-resistance, which is one of the important characteristics of a switch, may be obtained.

Effects of the Invention

As described above, according to the inventions of the present application, a normally-off vertical nitride semiconductor transistor device with a positive threshold voltage and low threshold voltage variation may be obtained.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 2 is a table showing dimensions and material characteristics assumed in the two-dimensional device simulation of the vertical nitride semiconductor transistor device provided by the first embodiment of the first invention of the present application shown in FIG. 1.

DESCRIPTION OF THE EMBODIMENTS

Figure 1:
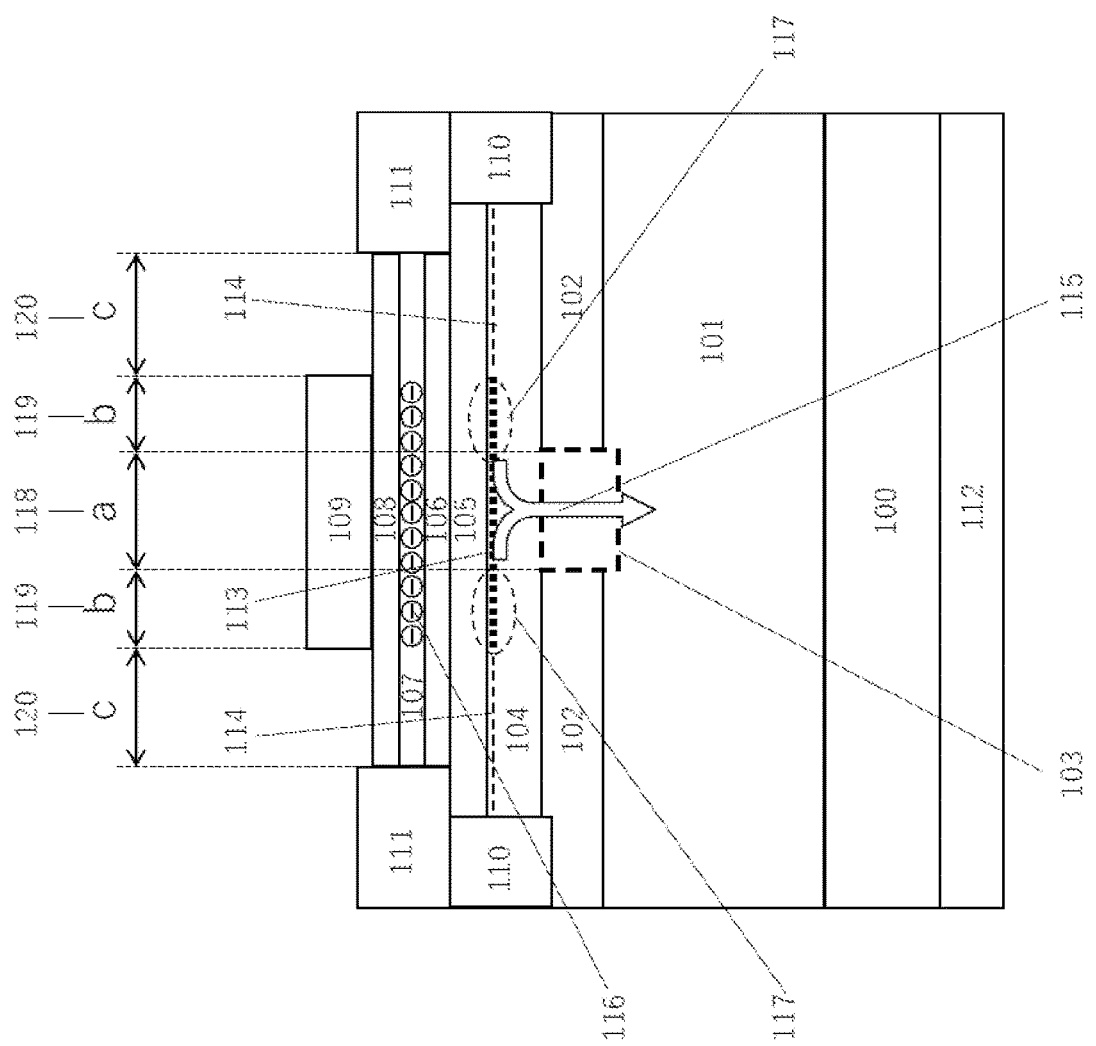
FIG. 1 is a cross-sectional view showing the vertical nitride semiconductor transistor device provided by the first embodiment of the first invention of the present application.

FIG. 1 is a cross-sectional view showing the vertical nitride semiconductor transistor device provided by the first embodiment of the first invention of the present application. In the present embodiment and other embodiments of the invention of the present application, conduction electrons are used as conduction carriers. A drift layer 101 is epitaxially grown on a substrate 100. The substrate 100 may adopt n-type GaN, SiC, Si, etc. In a case where the nitride semiconductor is epitaxially grown, good crystallinity may be obtained by growing the nitride semiconductor in the c-axis direction. Therefore, the substrate 100 is preferably a single-crystal substrate having a crystal plane orientation that allows epitaxial growth in the c-axis direction. For example, in a case where a GaN substrate or a SiC substrate having a hexagonal crystal structure is used, a single-crystal substrate having the crystal plane orientation of the substrate in the c-axis direction is used. In a case where a GaN substrate is used, a substrate having a Ga surface on which epitaxial crystal growth is particularly easy is preferably used. In a case where a Si substrate is used, if a substrate having a crystal plane orientation of (111) is used, epitaxial growth of the nitride semiconductor in the c-axis direction may be obtained. Between the substrate 100 and the drift layer 101, a buffer layer may be inserted for the objective of improving the crystallinity during epitaxial growth of the drift layer 101. In addition, the drift layer 101 may adopt n-type GaN, n-type AlGaN, or AlGaN with a composition gradient, or the like. A barrier layer 102, a first nitride semiconductor layer 104, and a second nitride semiconductor layer 105 are disposed at the upper part of the drift layer 101. The barrier layer 102 is provided for the objective of preventing the flow of conduction electrons, but a part of the barrier layer 102 is provided with an opening 103 that does not block the flow of electrons. There are various methods for making the opening 103. For example, the barrier layer 102 may be formed on the entire surface of the drift layer 101, and a part of the opening 103 may be removed by wet etching or dry etching. Then, the first nitride semiconductor layer 104 is grown to fill the opening 103. In this case, for the barrier layer 102, p-type GaN, p-type AlGaN, a high-resistance nitride semiconductor doped with a dopant for forming deep trap energy levels, an insulator, or a laminated structure thereof, etc. grown epitaxially on the drift layer 101 is used. Alternatively, after the drift layer 101 is grown, a p-type dopant may be selectively introduced to the surface part other than the opening by ion implantation and activated by subsequent heat treatment, thereby forming the barrier layer 102 including a p-type layer. Alternatively, after the drift layer 101, the barrier layer 102 containing a p-type nitride semiconductor, the first nitride semiconductor layer 104, and the second nitride semiconductor layer 105 are epitaxially grown sequentially, an n-type dopant is selectively ion-implanted into the opening 103 and activated by subsequent heat treatment, so that the barrier layer 102 of the opening 103 undergoes n-type inversion. The second nitride semiconductor layer 105 contains at least a nitride semiconductor having a band gap larger than at least a part of the nitride semiconductor of the first nitride semiconductor layer 104. For example, GaN is used as the first nitride semiconductor layer 104, and AlGaN is used as the second nitride semiconductor layer 105. Thus, a conduction layer 113 (represented by the thick dashed line in FIG. 1) and a conduction layer 114 (represented by the thin dashed line in FIG. 1) containing two-dimensional electron gas are formed at the first nitride semiconductor layer 104 side of the interface between the second nitride semiconductor layer 105 and the first nitride semiconductor layer 104. The channel region 117 is represented by a dashed ellipse in FIG. 1. For the objective of promoting electron conduction from the channel region 117 to the drift layer 101 through the opening 103, the first nitride semiconductor layer 104 may be doped with an n-type dopant. Then, a first insulating film 106, a second insulating film 107, and a third insulating film 108 each including a single-layer film or a laminated film are sequentially deposited on the second nitride semiconductor layer 105. At this point, the material and film-forming method of the second insulating film 107 are selected with the film containing charge traps in the following manner: the energy levels of the charge traps are located inside the band gap of at least a part of the first insulating film 106 and located inside the band gap of at least a part of the third insulating film 108. For example, a film formed by silicon nitride, hafnium oxide, or zirconium oxide via plasma-enhanced chemical vapor deposition (PECVD) or atomic layer deposition (ALD) is used as the second insulating film. Moreover, the first insulating film 106 and the third insulating film 108 adopt, for example, silicon oxide, aluminum oxide, or a laminated film thereof. The film-forming method may be the same as the second insulating film 107. Then, a gate electrode 109 is formed on the third insulating film 108. On the second nitride semiconductor layer 105, a source electrode 111 is formed to obtain good electrical connection with low resistance with respect to the conduction layer 114. As the electrode material, a multilayer film formed by a Ti lower layer and an Al upper layer is used, for example. In addition, when a p-type nitride semiconductor is used in the barrier layer 102, a body electrode 110 may be provided in order to fix the potential. For example, Pd, Pt, or Ni is used as the electrode material. The source electrode 111 is formed to also be electrically connected to the body electrode 110 at the same time. The drain electrode 112 is formed at the back surface of the substrate 100. The source electrode 111 may be formed before the gate electrode 109 is formed. For example, after the second nitride semiconductor layer 105 is formed, the body electrode 110 and the source electrode 111 are formed first, then the first insulating film 106, the second insulating film 107, and the third insulating film 108 are deposited, and then the gate electrode 109 is formed. The drain electrode 112 of the back surface may also be formed before other electrodes are formed.

Figure 17A:
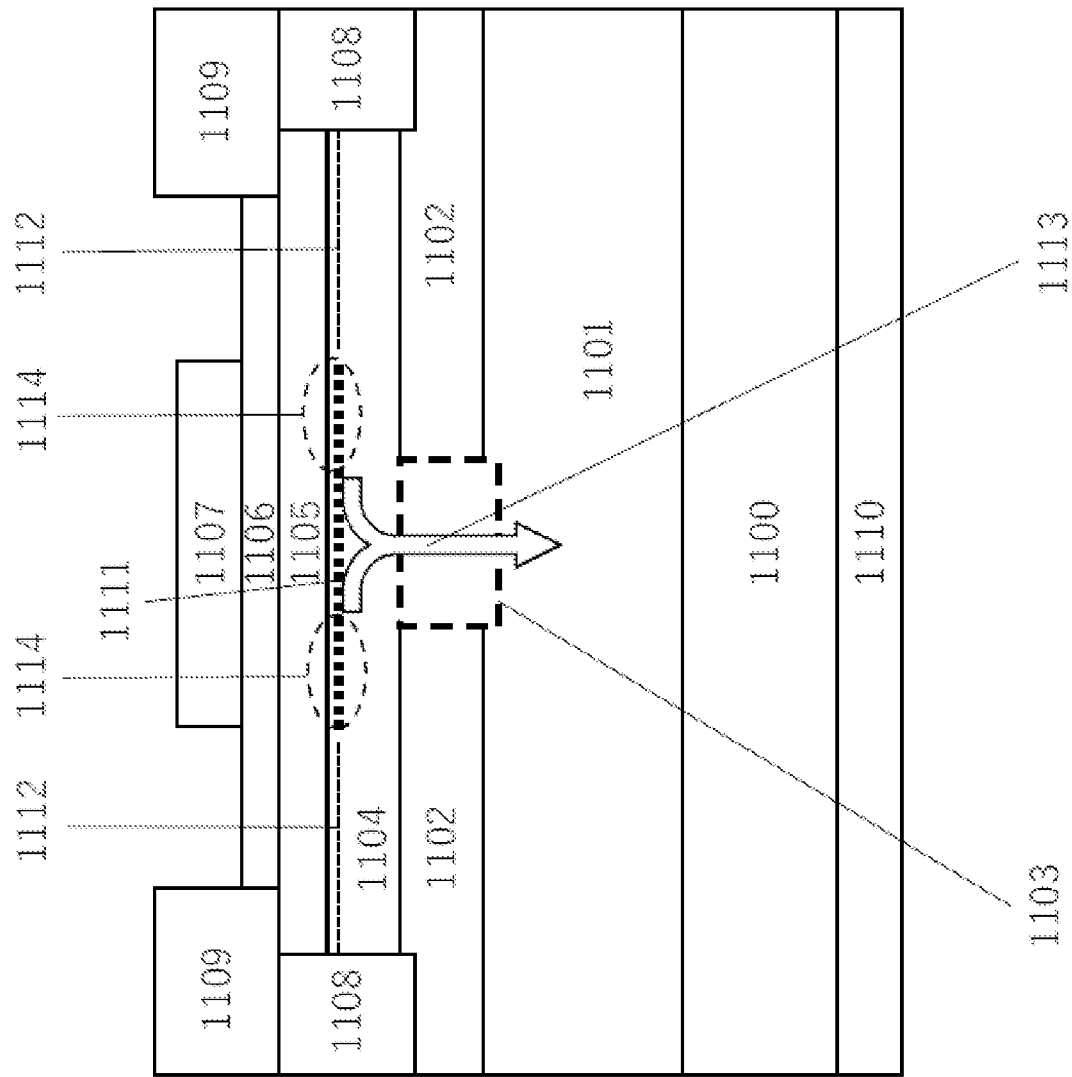
FIG. 17(a) is a cross-sectional view showing a vertical nitride semiconductor transistor device as the first current approach.
Figure 17B:
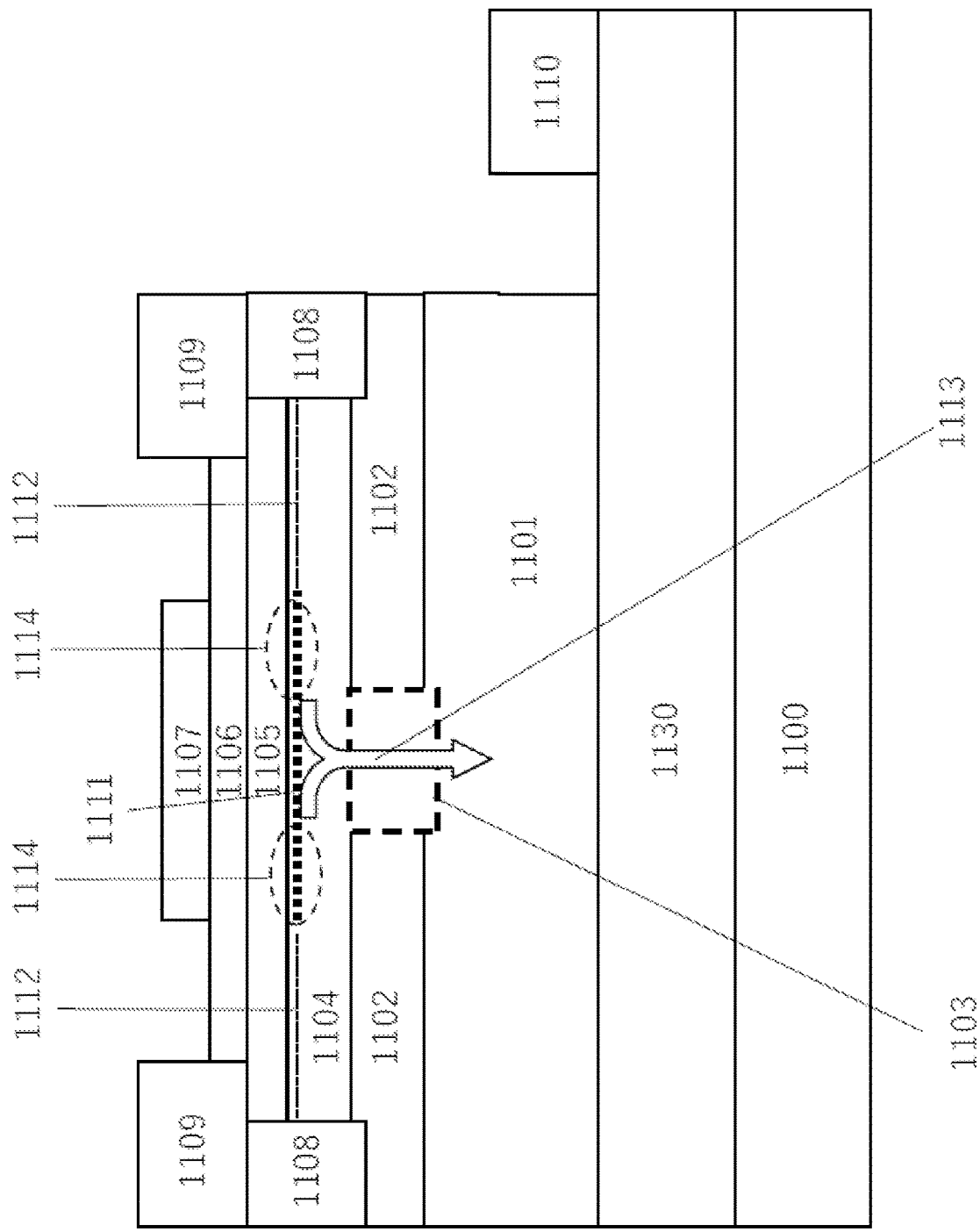
FIG. 17(b) is a cross-sectional view showing a vertical nitride semiconductor transistor device as the second current approach.
Figure 18:
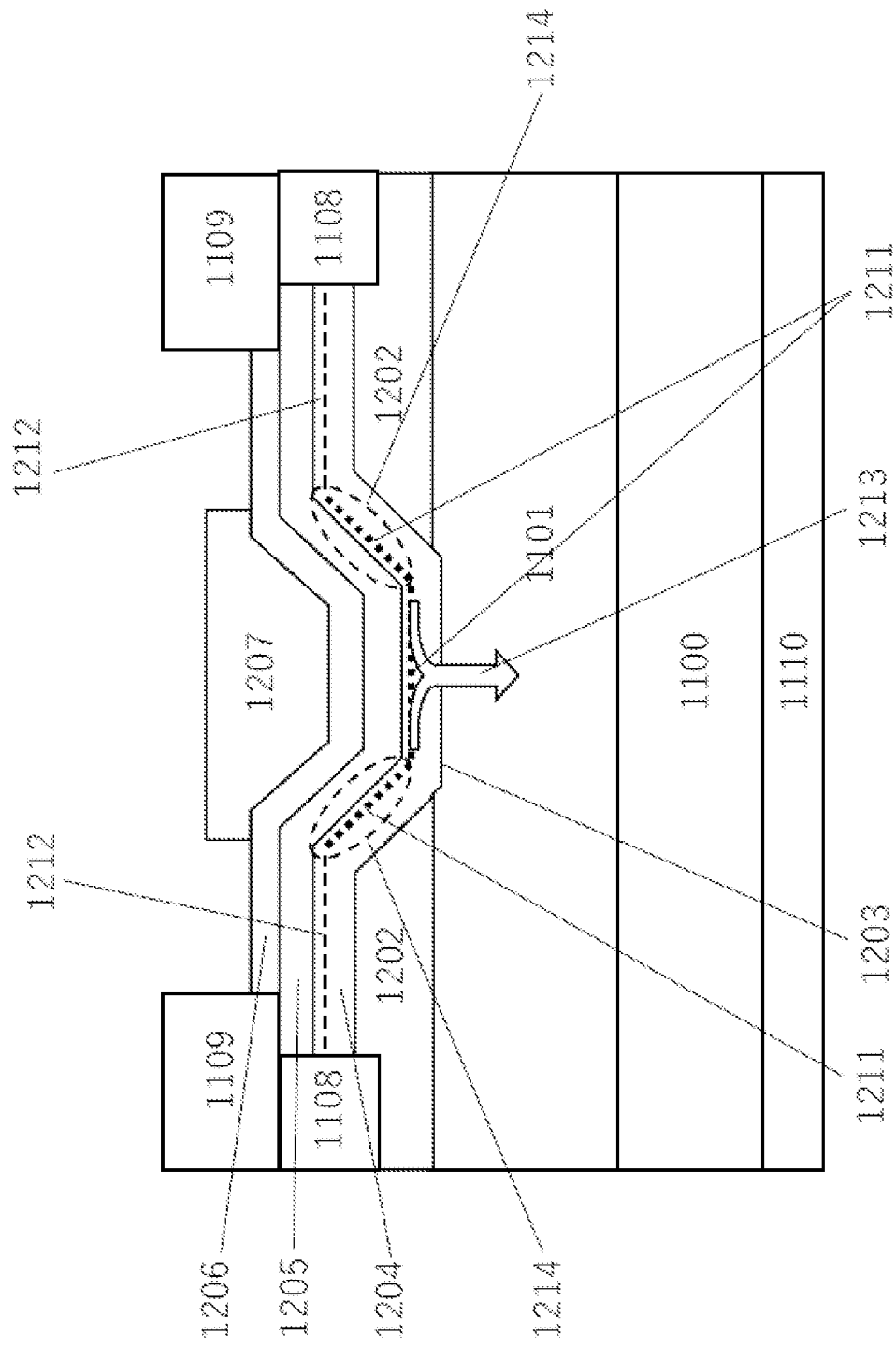
FIG. 18 is a cross-sectional view showing a vertical nitride semiconductor transistor device as the third current approach.

Regarding the first embodiment of the first invention of the present application shown in FIG. 1, the gate insulating film 1106 in the first current approach shown in FIG. 17(a) may assumed to be replaced with a laminated film including the first insulating film 106, the second insulating film 107, and the third insulating film 108. Therefore, the working principle of the transistor is basically the same as the first current approach shown in FIG. 17(a), in that the conduction electrons flowing out from the source electrode 111 flow in the channel region 117 including the conduction layer 113 through the conduction layer 114, then flow into the drift layer along an arrow 115 indicating the flow of conduction electrons, and then reach the drain electrode 112 through the substrate 100. Moreover, the present embodiment is characterized in that fixed charges 116 may be accumulated in the second insulating film 107. The potential energy of the second insulating film 107 may be changed in accordance with the sign and amount of the accumulated charges. For example, in a case where negative charges are accumulated, the potential energy with respect to the electrons is increased, and accordingly, the gate voltage dependence of the drain current is shifted toward the positive gate voltage direction as a whole. By accumulating a sufficient amount of negative charge, the threshold voltage for substantially eliminating conduction electrons in the channel region 117 to block the current between the source electrode and the drain electrode may be set to a positive value. In this way, the normally-off action that is difficult to achieve in the first current approach may be achieved. Moreover, when GaN is used as the first nitride semiconductor layer 104 and AlGaN is used as the second nitride semiconductor layer 105, the thickness of the second nitride semiconductor layer 105 is set to about 0.01 microns or more, thus inducing a sufficient amount of conduction electrons in the conduction layer 114 to reduce the resistance of the region from the source electrode to the gate electrode. Regarding the AlN mixed crystal composition ratio (mole fraction) of AlGaN (expressed as $Al_xGa_{1-x}N$) of the second nitride semiconductor layer 105, by appropriately adjusting the value of x in the formula $Al_xGa_{1-x}N$, AlGaN having a different lattice constant from GaN does not cause significant lattice relaxation. Generally, x is adjusted between 0.1 and 0.4.

To accumulate negative fixed charges on the second insulating film 107, a voltage that is positive compared to the source electrode 111 may be applied to the gate electrode 109 so that electrons flow into the second insulating film 107 from the second nitride semiconductor layer 105 by tunneling through the first insulating film 106. For example, silicon nitride film formed by PECVD is used as the second insulating film 107, and silicon oxide is used as the first insulating film 106 and the third insulating film 108. In this case, the silicon nitride film formed by PECVD contains a plurality of charge traps with energy levels located inside the band gap of silicon oxide, and electrons tunneling through the first insulating film 106 are captured by the charge traps. Since the trap energy levels in the silicon nitride film are located in a deeper energy than the conduction band of silicon oxide, the captured charges are hardly released again, and are retained as the fixed charges 116. In addition, when negative charges are accumulated in the second insulating film 107 by this method, the thickness of the first insulating film 106 needs to be reduced in order to sufficiently obtain electron tunneling. But if too thin, the accumulated negative charges are released again due to tunneling. Generally, the thickness of the first insulating film 106 is set to a range of 5 nm to 20 nm. Moreover, to prevent the charges accumulated in the second insulating film 107 from being released again due to tunneling, the third insulating film 108 is made thicker. However, if too thick, the coupling capacitance between the gate electrode 109 and the channel region 117 is weakened, the change in the amount of conduction electrons in the channel region 117 caused by the gate voltage is smaller, and the amount of change in current is smaller, so the characteristics of the transistor are degraded. Generally, the thickness of the third insulating film 108 is set to a range of 10 nm to 40 nm.

As another method of accumulating negative fixed charges 116 in the second insulating film 107, a voltage that is negative compared to the source electrode 111 may be applied to the gate electrode 109, so that the electrons tunnel through the third insulating film 108 from the gate electrode 109 and are injected into the second insulating film 107. In this case, the thickness of the third insulating film is adjusted in order to promote tunneling.

Next, the characteristics of the vertical nitride semiconductor transistor device provided by the first embodiment of the first invention of the present application are described. FIG. 2 is a table showing device dimensions and material types in a two-dimensional device simulation of the vertical nitride semiconductor transistor device shown in FIG. 1. The drift layer 101 includes an n-type GaN layer with a thickness of 2 microns and a dopant concentration of $1\times10^{15}$ cm$^{-3}$. In addition, the barrier layer 102 includes a p-type GaN layer with a thickness of 0.4 microns and a dopant concentration of $1\times10^{17}$ cm$^{-3}$. In addition, the first nitride semiconductor layer 104 includes a GaN layer with a thickness of 0.2 μm and a dopant concentration of $1\times10^{15}$ cm$^{-3}$. The second nitride semiconductor layer 105 includes an AlGaN layer with a thickness of 0.01 microns, an AlN mixed crystal composition ratio (mole fraction x when expressed as $Al_xGa_{1-x}N$) of 0.3, and undoped with dopants. Regarding the gate insulating film, the first insulating film 106 and the third insulating film 108 are silicon oxide, and the second insulating film 107 is silicon nitride. The thickness is 0.01 microns in all cases. Regarding the lateral dimension, a width (a) 118 of the opening 103 is set to 2 microns. The channel region 117 corresponds to the conduction layer 113 except for the part above the opening 103, and a width (b) 119 thereof is set to 1 micron. In addition, a distance (c) 120 between the gate electrode 109 and the source electrode 111 is set to 1 micron. In addition, the body electrode 110 is not included in the two-dimensional device simulation.

Figure 3:
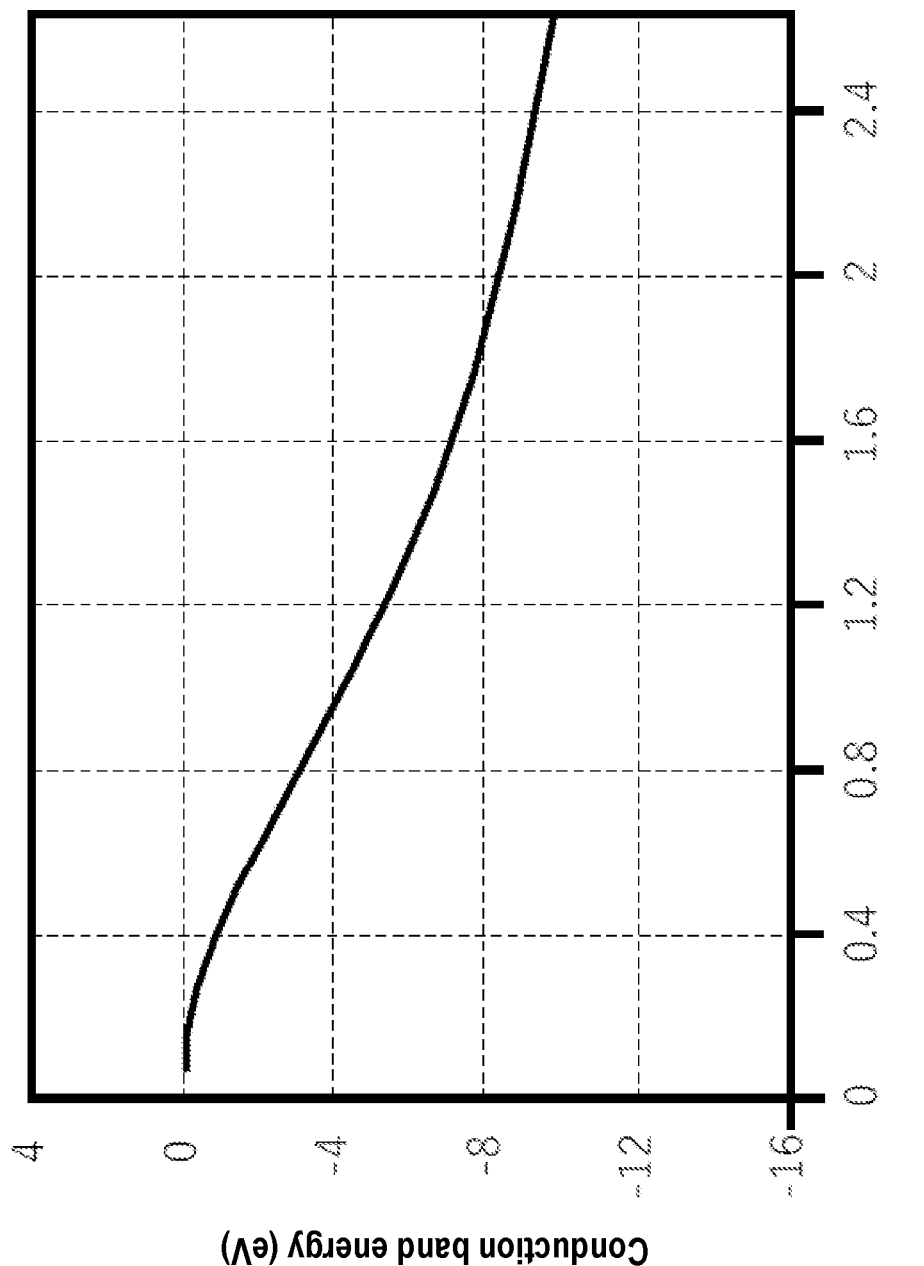
FIG. 3 is a graph showing the depth dependence of conduction band energy in the drift layer obtained by the two-dimensional device simulation of the vertical nitride semiconductor transistor device provided by the first embodiment of the first invention of the present application shown in FIG. 1 and FIG. 2.
Figure 4:
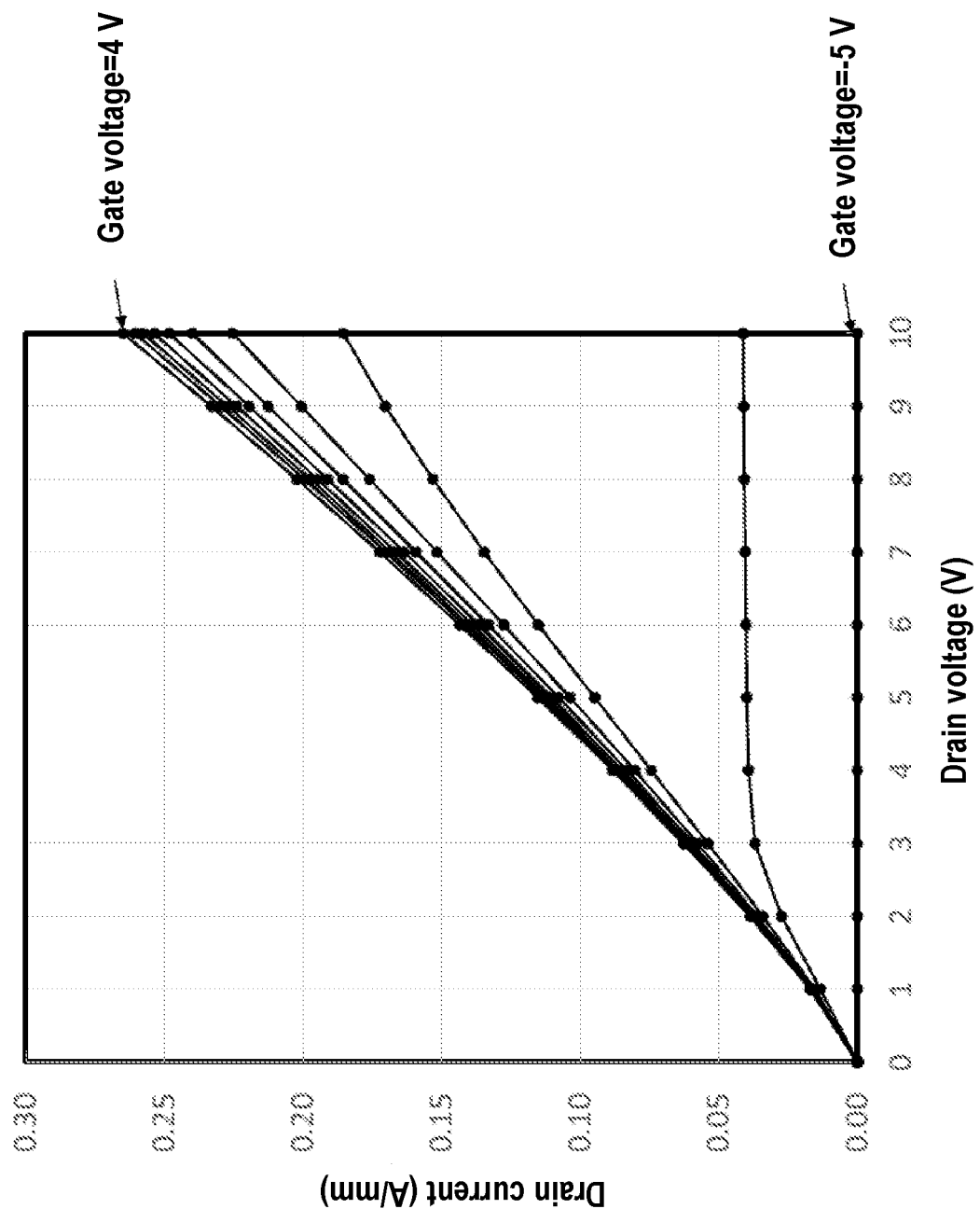
FIG. 4 is a graph showing the drain voltage dependence of the drain current of the vertical nitride semiconductor transistor device provided by the first embodiment of the first invention of the present application shown in FIG. 1 and FIG. 2 before negative charges are accumulated in the charge storage insulating film.
Figure 5:
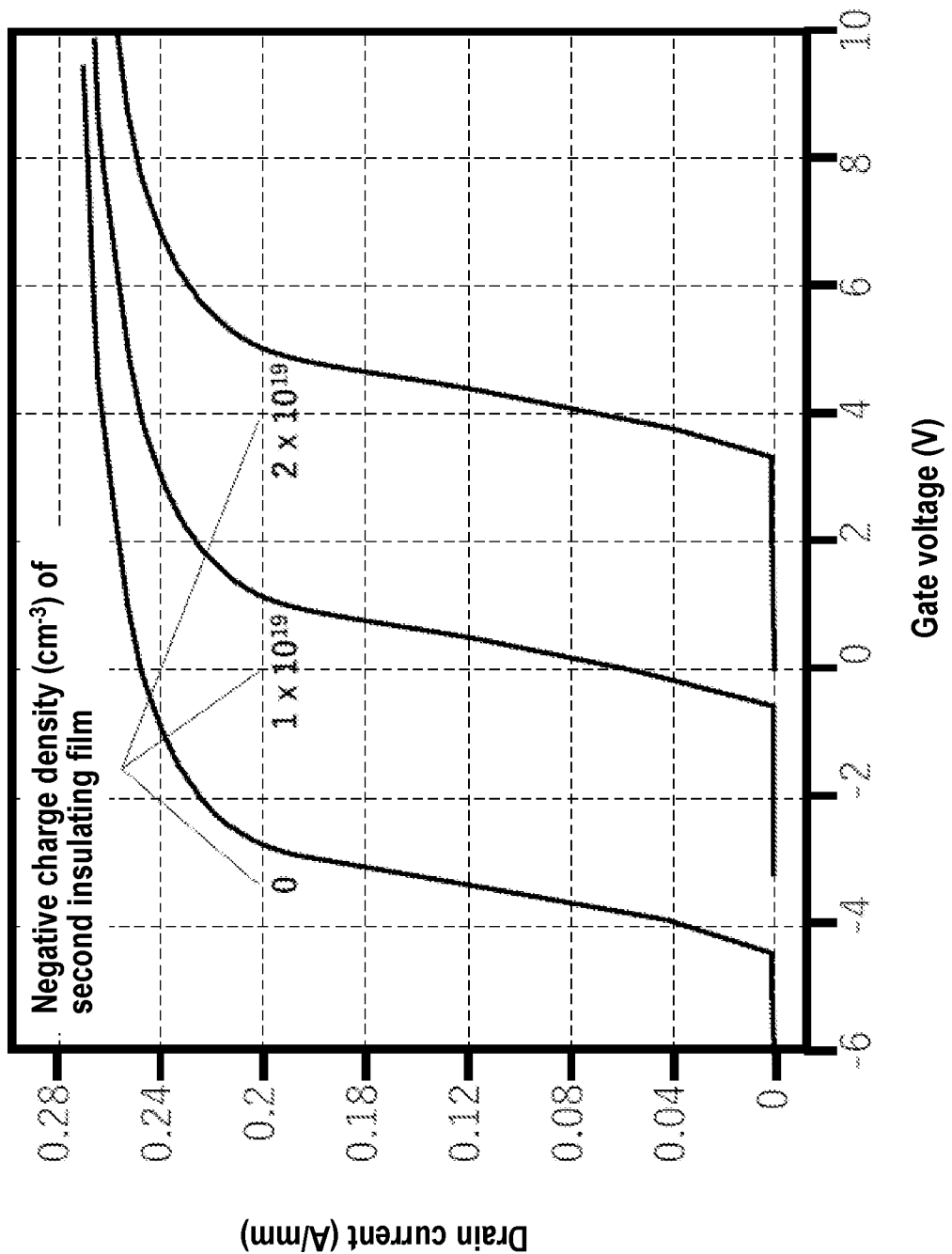
FIG. 5 is a graph showing the gate voltage dependence of the drain current of the vertical nitride semiconductor transistor device provided by the first embodiment of the first invention of the present application shown in FIG. 1 and FIG. 2.

Next, the simulation results are described. FIG. 3 shows the depth dependence of the conduction band energy in the drift layer 101 closer to the lower side than the opening 103. The gate is in an on state. In addition, the source electrode 111 is grounded, and the voltage of the drain electrode 112 is 10 V. It is seen that the potential in the drift layer is changed gently in the depth direction. FIG. 4 shows the drain voltage dependence of drain current. Fixed charges are not accumulated in the second insulating film 107. The gate voltage is changed from −5 V to 4 V in a unit of 1 V, and drain voltage is scanned under each gate voltage. The drain current on the vertical axis of FIG. 4 is a current value per unit mm when the transistor device is extended in a direction perpendicular to the paper surface while maintaining the cross-sectional structure shown in FIG. 1. The on-resistance and on-current desired if functioning as switching elements are obtained. FIG. 5 shows the characteristics of scanning the gate voltage with the drain voltage fixed at 10 V. Three curves are shown in the figure, but they show the case where the negative fixed charges 116 accumulated in the second insulating film 107 are changed. In a case where, in the second insulating film 107 at the lower part of the gate electrode 109, negative fixed charges 116 are accumulated by being uniformly distributed in both the vertical and horizontal directions, the curve in FIG. 5 shows the case where the negative charge density per unit volume is 0, $1\times10^{19}$ cm$^{-3}$, and $2\times10^{19}$ cm$^{-3}$ from the left. As the amount of negative charges accumulated in the second insulating film is increased, the current-voltage characteristics are shifted to the positive gate voltage side, and when the negative charge density is $2\times10^{19}$ cm$^{-3}$, the threshold voltage blocking the drain current is 3.4 V. Normally-off characteristics with a threshold voltage exceeding 3 V desired for a high-power switch are thus achieved.

In a preferred embodiment of the first embodiment of the first invention of the present application shown in FIG. 1, the first insulating film 106 adopts a laminated film formed of aluminum oxide as the lower layer and silicon oxide as the upper layer. Aluminum oxide does not readily generate interface trap energy levels in the interface with the nitride semiconductor layer. Therefore, when a positive voltage is applied to the gate electrode to increase the number of conduction electrons of the channel region to increase flowing current, there is less impact of the interface trap energy levels existing in the interface between the nitride semiconductor of the channel region and the first insulating film. As a result, a vertical nitride semiconductor transistor device with excellent on-resistance, which is one of the important characteristics of a switch, may be obtained.

Figure 6:
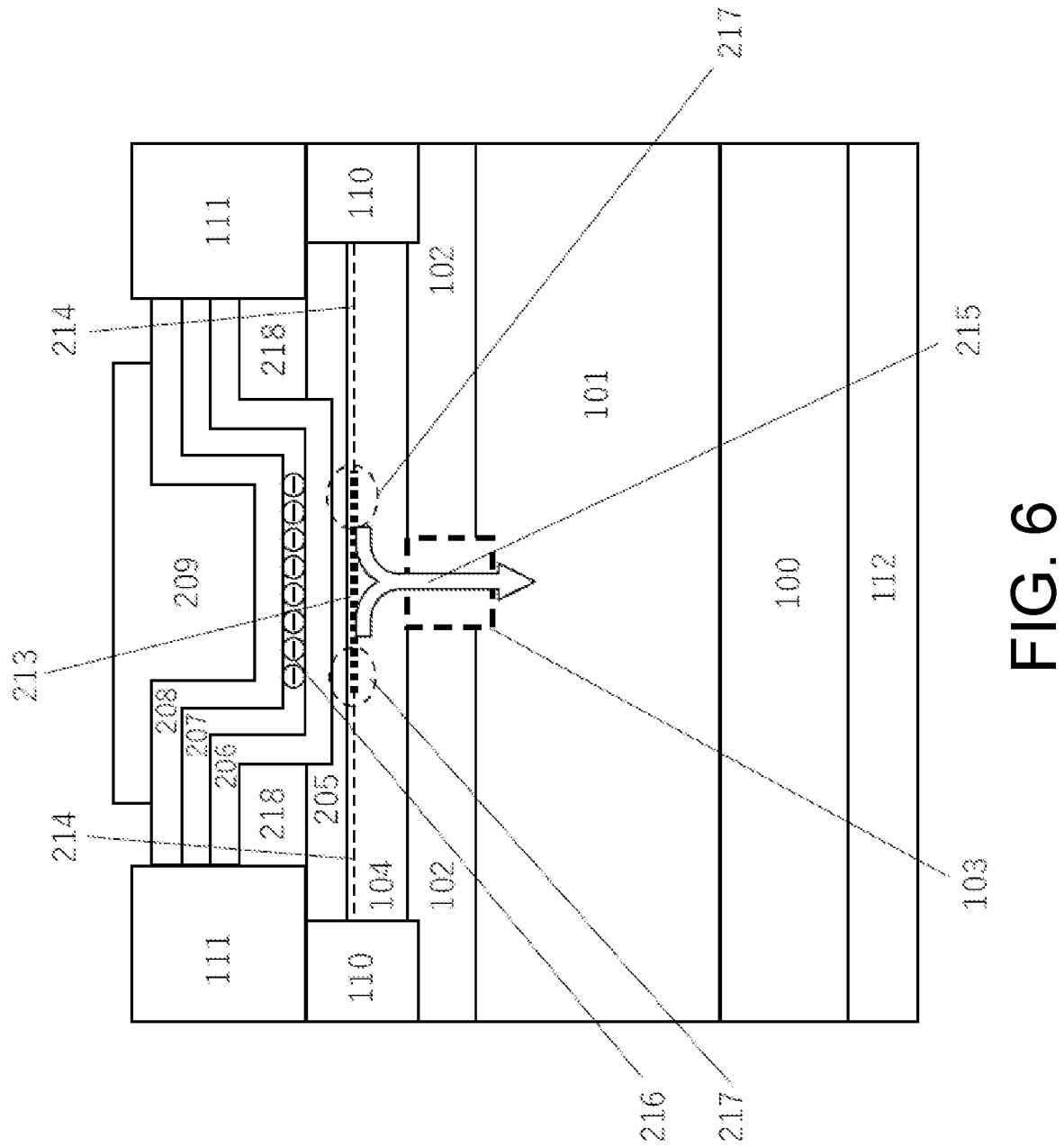
FIG. 6 is a cross-sectional view showing the vertical nitride semiconductor transistor device provided by the second embodiment of the first invention of the present application.

FIG. 6 is a cross-sectional view showing a vertical nitride semiconductor transistor device provided by the second embodiment of the first invention of the present application. The details are the same as the first embodiment of the first invention of the present application until the drift layer 101, the barrier layer 102, the opening 103, the first nitride semiconductor layer 104, and a second nitride semiconductor layer 205 are formed on the substrate 100. Then, a field insulating film 218 is deposited, and the field insulating film 218 of the gate electrode forming part is removed, and then the second nitride semiconductor layer 205 is etched to reduce thickness. For the field insulating film 218, aluminum oxide, silicon oxide, silicon nitride, or a multilayer film thereof may be used. Then, a first insulating film 206, a second insulating film 207, and a third insulating film 208 are sequentially deposited, and lastly a gate electrode 209 is formed. In the transistor device of the present embodiment, since the second nitride semiconductor layer 205 of the gate electrode forming part is thinner and the influence of polarized charges is weakened, the number of conduction electrons induced in the conduction layer 213 is reduced, and the threshold voltage before the fixed charges are accumulated in the second insulating film 207 is a negative voltage smaller than that of the first embodiment of the first invention of the present application. Therefore, the amount of negative fixed charges 216 accumulated in the second insulating film 207 for making the threshold voltage a positive voltage to obtain desired normally-off characteristics may be reduced. Moreover, by maintaining the original thickness of the second nitride semiconductor layer between the gate electrode 209 and the source electrode 111, the number of conduction electrons induced in the conduction layer 214 in this part is not reduced. Therefore, electrical connection from the source electrode 111 to the channel region 217 may be obtained with low resistance. The material and film forming method of the second insulating film 207 are selected with the film containing charge traps in the following manner: the energy levels of the charge traps are located inside at least a part of the band gap of the first insulating film 206 and located inside at least a part of the band gap of the third insulating film 208. This aspect is the same as the first embodiment of the first invention of the present application. In addition, after the nitride semiconductor layer 205 at the opening of the field insulating film 218 is etched, the remaining field insulating film 218 may be removed, and then the first insulating film 206, the second insulating film 207, and the third insulating film 208 may be deposited. Moreover, the body electrode 110 and the source electrode 111 may be formed before the gate electrode 209 is formed. For example, first, the body electrode 110 is formed, and then the field insulating film 218 is deposited, and the source electrode 111 is formed after the field insulating film 218 of the source electrode forming part is removed. Then, after the field insulating film 218 of the gate electrode forming part is removed, the second nitride semiconductor layer 205 is etched, and then the manufacturing process of the gate part is performed until the gate electrode 209 is formed.

Figure 7:
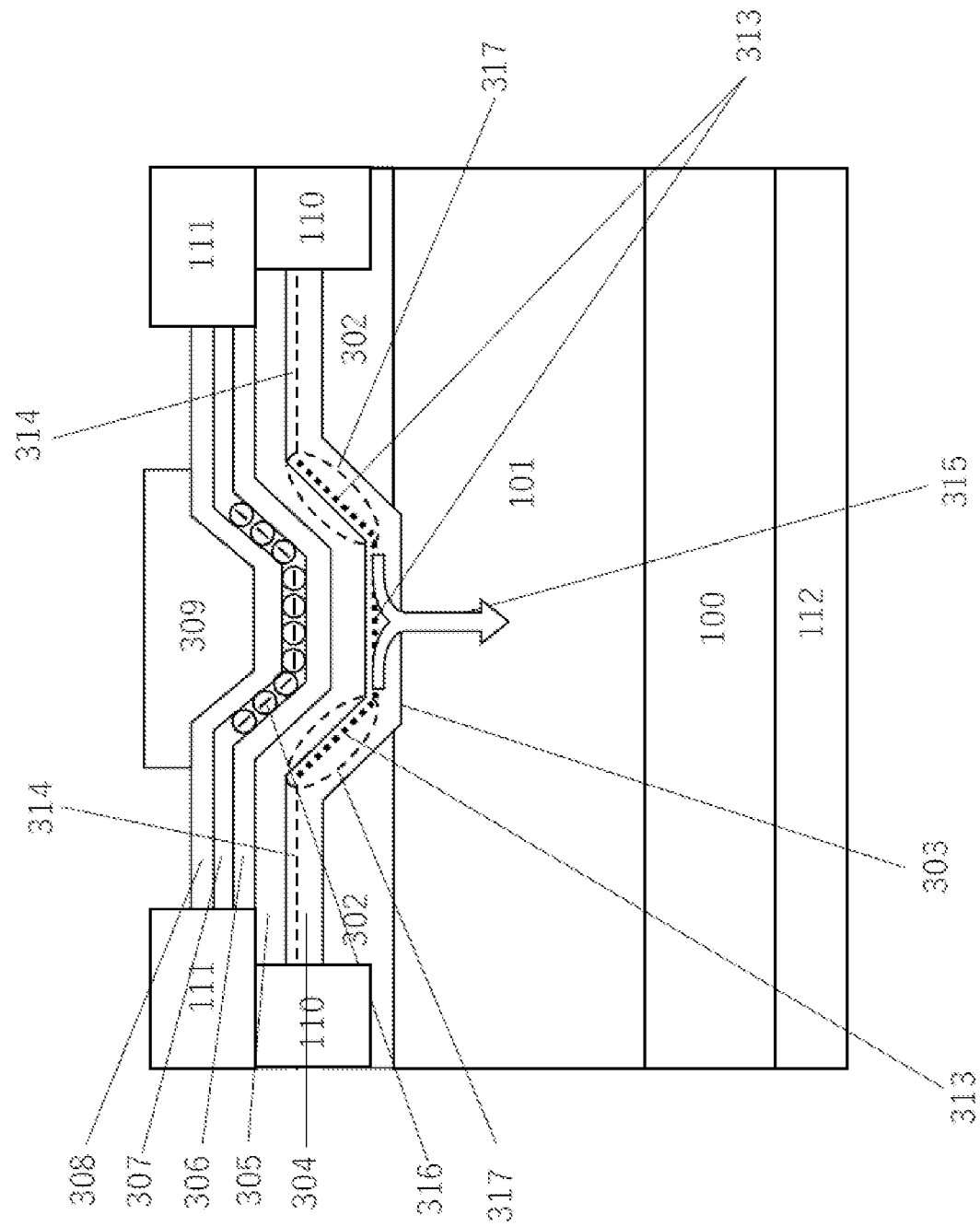
FIG. 7 is a cross-sectional view showing the vertical nitride semiconductor transistor device provided by the third embodiment of the first invention of the present application.

FIG. 7 is a cross-sectional view showing the vertical nitride semiconductor transistor device provided by the third embodiment of the first invention of the present application. In the present embodiment, for a barrier layer 302, a p-type nitride semiconductor layer or a high-resistance nitride semiconductor layer grown on the drift layer 101 is used, and an opening 303 with an incline is formed by etching. Then, a first nitride semiconductor layer 304 and a second nitride semiconductor layer 305 are grown at the upper surface of the opening 303 containing the inclined part. Then, a first insulating film 306, a second insulating film 307, and a third insulating film 308 are sequentially deposited thereon. Next, a gate electrode 309 is formed thereon to cover the entire surface of the opening 303. The rest is the same as the first embodiment of the first invention of the present application. In the present embodiment, at least a part of a conduction layer 313 is formed at the inclined part of the opening 303. The conduction layer 313 of the inclined part forms a channel region 317, and conduction electrons flowing out of the source electrode flow into the drift layer 101 from a conduction layer 314 through the channel region 317 and along an arrow 315. As described in the third current approach, when the crystal plane orientation of the nitride semiconductor layered structure deviates from the c-axis direction, the resulting polarization is weakened. Therefore, when comparison is made before the fixed charges are accumulated in the second insulating film 307, the threshold voltage becomes a negative voltage smaller than that of the first embodiment of the first invention of the present application. Therefore, the amount of negative fixed charges 316 accumulated in the second insulating film 307 for making the threshold voltage a sufficiently large positive voltage to obtain desired normally-off characteristics may be reduced. In addition, in a case where threshold voltage variation becomes an issue, the variation may be reduced by adjusting the amount of charges accumulated in the second insulating film 307 for each transistor. The material and film forming method of the second insulating film 307 are selected with the film containing charge traps in the following manner: the energy levels of the charge traps are located inside the band gap of the first insulating film 306 and located inside the band gap of the third insulating film 308. This aspect is the same as the first embodiment of the first invention of the present application.

Figure 8:
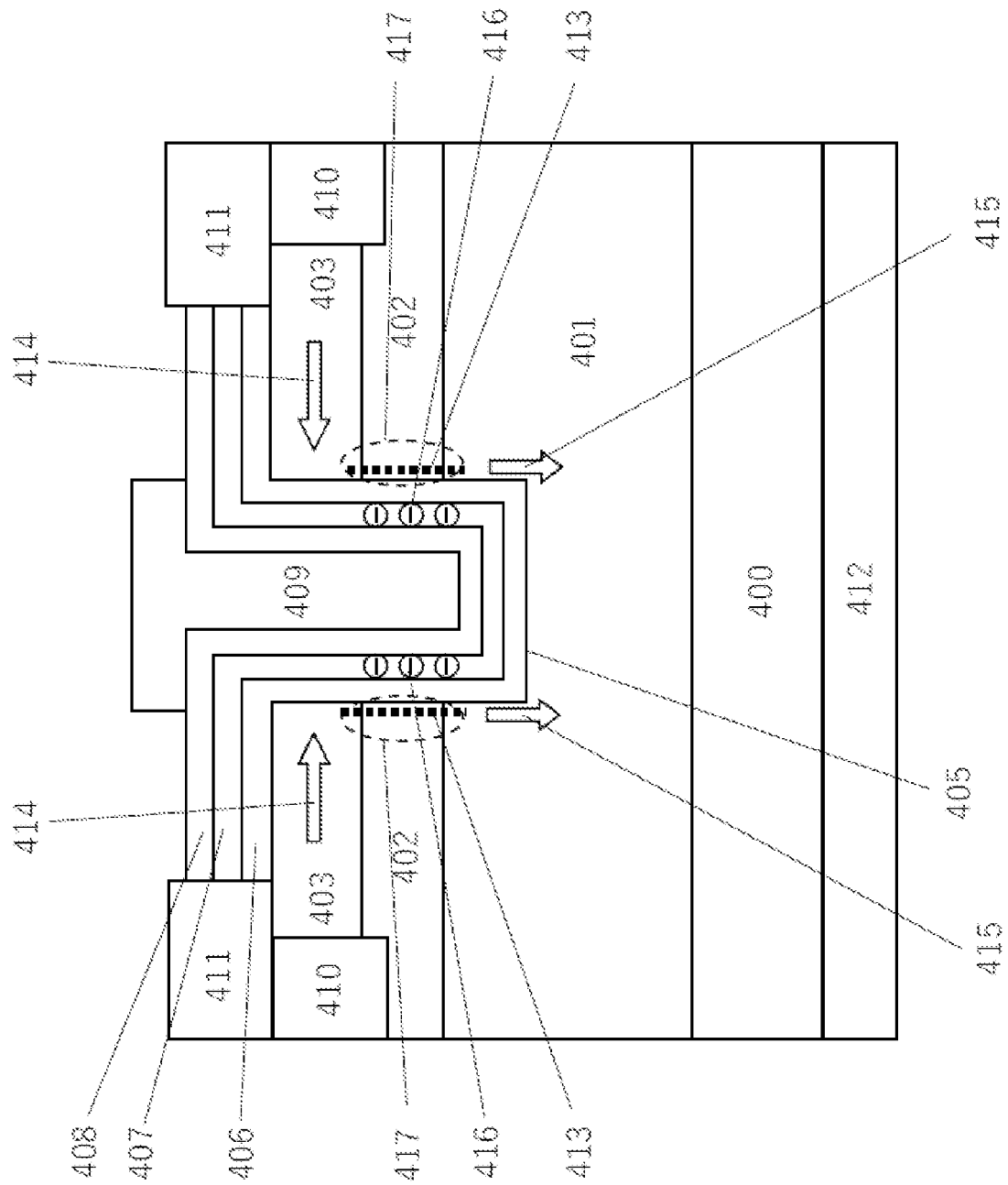
FIG. 8 is a cross-sectional view showing the vertical nitride semiconductor transistor device provided by the fourth embodiment of the first invention of the present application.

FIG. 8 is a cross-sectional view showing the vertical nitride semiconductor transistor device provided by the fourth embodiment of the first invention of the present application. A drift layer 401 is epitaxially grown on a substrate 400. Up to this point, the details are the same as the first embodiment of the first invention of the present application. Then, a p-type third nitride semiconductor layer 402 and an n-type fourth nitride semiconductor layer 403 are grown on the drift layer 401. In a preferred example, GaN is used as the third nitride semiconductor layer 402 and the fourth nitride semiconductor layer 403. Then, a trench 405 that penetrates the fourth nitride semiconductor layer 403 and the third nitride semiconductor layer 402 and reaches the drift layer 401 is formed. Then, a first insulating film 406, a second insulating film 407, and a third insulating film 408 are sequentially deposited to cover the inside of the trench 405. The types, properties, and deposition methods of the insulating films are as described in the first embodiment of the first invention of the present application. In addition, in order to improve the characteristics of the interface between the insulating films and the nitride semiconductors, a thin nitride semiconductor layer may also be grown, such as a GaN layer, inside the trench 405, and then the first insulating film 406, the second insulating film 407, and the third insulating film 408 are deposited in sequence. Generally, the thickness of the thin nitride semiconductor layer is selected in the range of 1 nm to 20 nm. Then, a gate electrode 409 is formed to cover the inner surface of the trench 405. A body electrode 410 is provided to be in electrical contact with the third nitride semiconductor layer 402 used as the body region. Then, the source electrode 411 is provided to be in electrical contact with the fourth nitride semiconductor layer 403 and the body electrode 410. The body electrode 410 may be provided for the objective of fixing the body region to the same potential as the source electrode, but may also be omitted. A drain electrode 412 is disposed at the back surface of the substrate 400. The source electrode 411 may be formed before the gate electrode 409 is formed. For example, after the fourth nitride semiconductor layer 403 is formed, the body electrode 410 and the source electrode 411 are formed first, then the trench 405 is formed, then the first insulating film 406, the second insulating film 407, and the third insulating film 408 are deposited, and then the gate electrode 409 is formed. The drain electrode 412 of the back surface may also be formed before other electrodes are formed.

Figure 19:
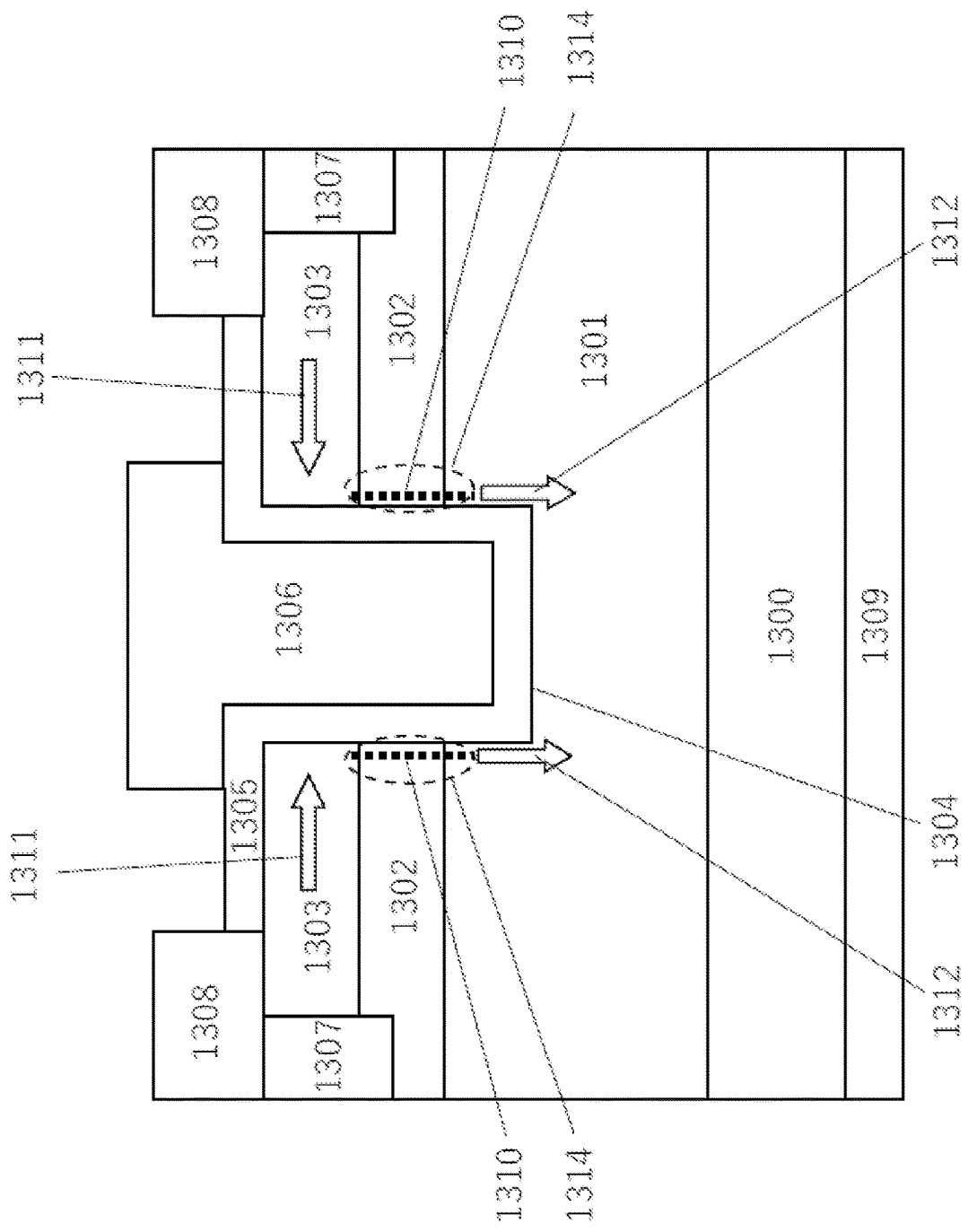
FIG. 19 is a cross-sectional view showing a vertical nitride semiconductor transistor device as the fourth current approach.

Regarding the fourth embodiment of the first invention of the present application shown in FIG. 8, the gate insulating film 1305 in the fourth current approach shown in FIG. 19 may assumed to be replaced with a laminated film including the first insulating film 406, the second insulating film 407, and the third insulating film 408. Therefore, the working principle of the transistor is basically the same as the fourth current approach shown in FIG. 19, in that the conduction electrons flowing out from the source electrode 411 flow in the trench direction along an arrow 414 indicating the flow of conduction electrons in the fourth nitride semiconductor layer 403, then flow into the drift layer 401 in the direction of an arrow 415 indicating the flow of conduction electrons through a channel region 417 including an inverted conduction layer 413, and then pass through the substrate 400 to reach the drain electrode 412. In addition, in the fourth embodiment of the first invention of the present application shown in FIG. 8, by accumulating fixed charges 416 in the second insulating film 407, the threshold voltage to eliminate conduction electrons in the channel region 417 thereby blocking the current between the source electrode 411 and the drain electrode 412 may be adjusted. In particular, negative fixed charges 416 may be accumulated in the second insulating film 407 to make the threshold voltage a positive value. Alternatively, in a case where the threshold voltage before the charge accumulation is already a positive value, the threshold voltage may be adjusted to a desired threshold voltage by accumulating negative or positive charges. Alternatively, the accumulated charges may be adjusted for each transistor to reduce the threshold voltage variation before accumulation. A voltage that is positive with respect to the source electrode 411 may be applied to the gate electrode 409, so that electrons are injected into the second insulating film 407 from the conduction layer 413 by tunneling through the first insulating film 406. For example, when silicon nitride deposited by PECVD is used as the second insulating film 407, and silicon oxide is used as the first insulating film 406 and the third insulating film 408, the PECVD silicon nitride film contains a plurality of charge traps with energy levels located inside the band gap of silicon oxide, and electrons tunneling through the first insulating film 406 are captured by the charge traps. Since the energy levels of the captured charges are located in energies deeper than the conduction bands of the first insulating film 406 and the third insulating film 408 containing silicon oxide, the charges are hardly released again, and are retained as fixed charges. Alternatively, by applying a voltage that is negative with respect to the source electrode 411 to the gate electrode 409, electrons may be injected into the second insulating film 407 from the gate electrode 409 by tunneling through the third insulating film 408. In this case, the thickness of the third insulating film 408 is reduced to promote tunneling. Positive fixed charges are accumulated in the insulating film 407 by hole injection, which may be achieved by hole tunneling from the third nitride semiconductor layer 402 or the gate electrode 409. The hole tunneling is made to be dominant by selecting suitable materials and thicknesses of the first insulating film 406 and the third insulating film 408 and adjusting the voltage applied to the gate electrode 409 and the source electrode 411.

Figure 9:
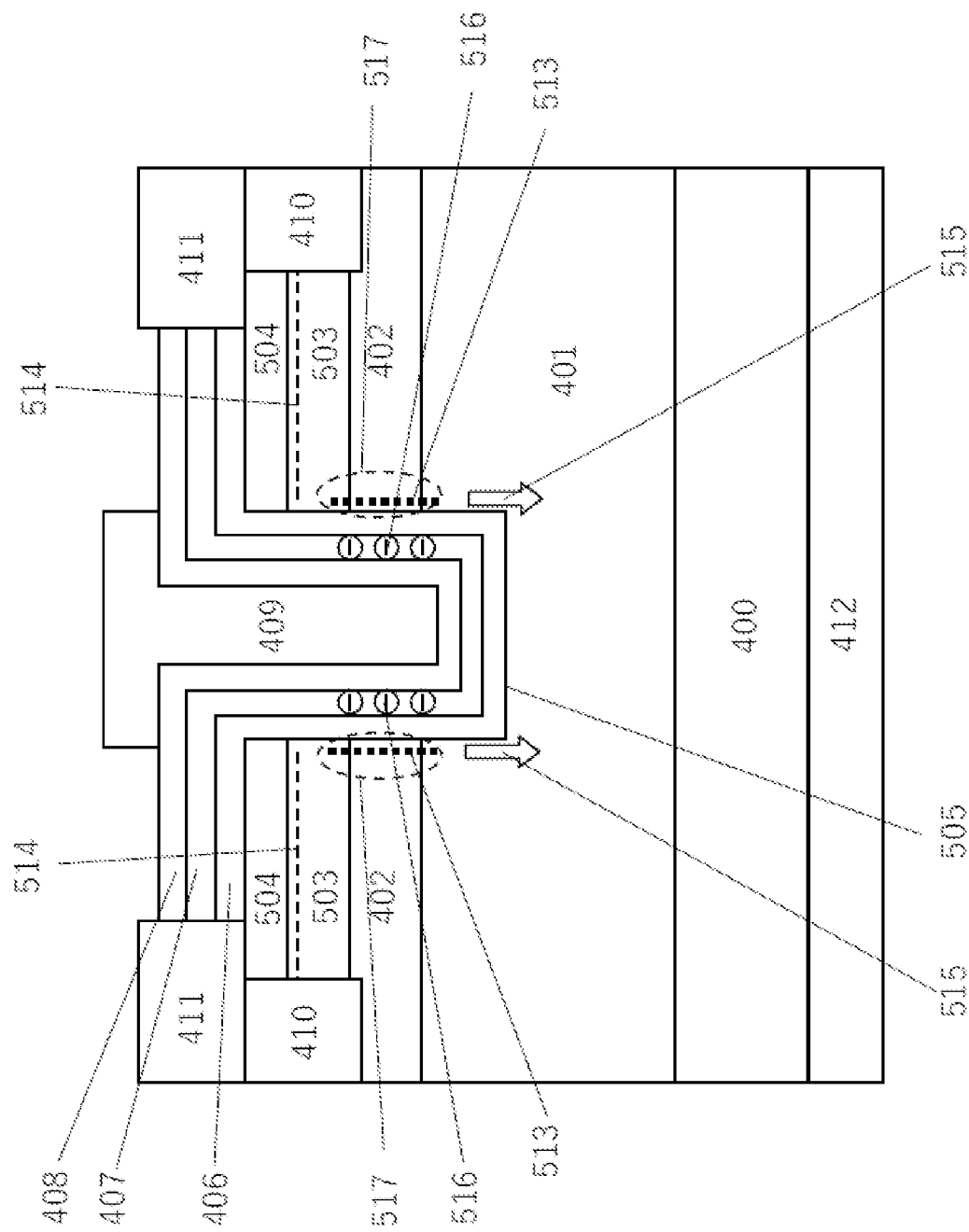
FIG. 9 is a cross-sectional view showing the vertical nitride semiconductor transistor device provided by the fifth embodiment of the first invention of the present application.

FIG. 9 is a cross-sectional view showing the vertical nitride semiconductor transistor device provided by the fifth embodiment of the first invention of the present application. The difference between the present embodiment and the fourth embodiment of the first invention of the present application is: after the p-type third nitride semiconductor layer 402 is grown, as a layer corresponding to the fourth nitride semiconductor layer, a nitride semiconductor layer including a first nitride semiconductor layer 503 and a second nitride semiconductor layer 504 is formed. Here, similar to the first embodiment of the first invention of the present application, the second nitride semiconductor layer 504 contains at least a nitride semiconductor having a band gap larger than at least a part of the nitride semiconductor of the first nitride semiconductor layer 503. For example, GaN is used as the first nitride semiconductor layer 503, and AlGaN is used as the second nitride semiconductor layer 504. Thus, a conduction layer 514 containing two-dimensional electron gas is formed at the first nitride semiconductor layer 503 side of the interface between the second nitride semiconductor layer 504 and the first nitride semiconductor layer 503. A nitride semiconductor layer formed by the first nitride semiconductor layer 503 and the second nitride semiconductor layer 504 may still induce conduction electrons in the conduction layer 514 using the charge polarization effect even in the case where an n-type dopant is not doped. Therefore, n-type conductivity may be substantially obtained, but in order to promote electron current toward a channel region 517 including the inverted conduction layer 513, the first nitride semiconductor layer 503 may be doped with an n-type dopant. In the transistor of the present embodiment, conduction electrons flowing out of the source electrode 411 flow into the drift layer 401 through the conduction layer 514 and the channel region 517 in the direction of an arrow 515 indicating the flow of conduction electrons.

Figure 10:
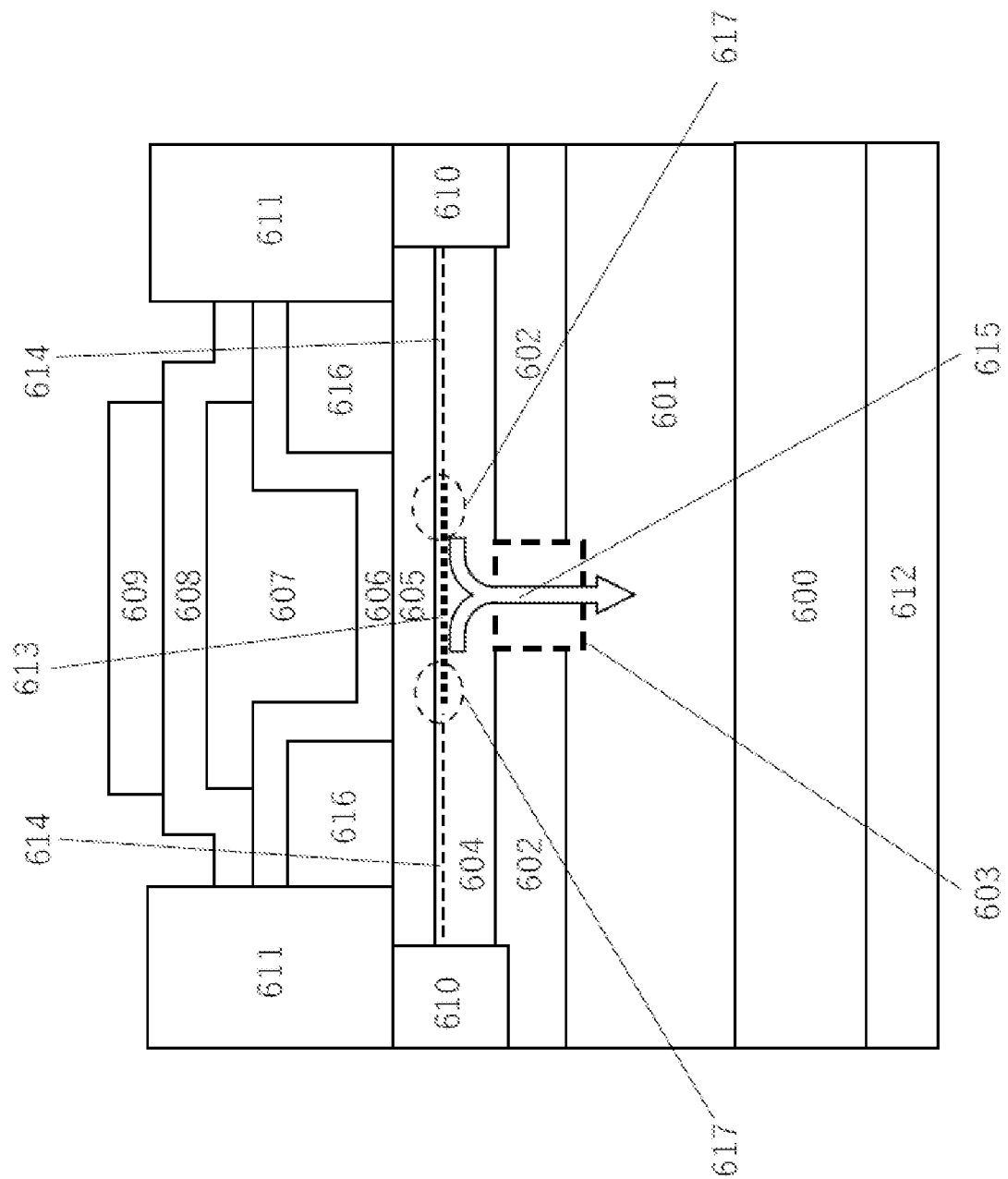
FIG. 10 is a cross-sectional view showing the vertical nitride semiconductor transistor device provided by the first embodiment of the second invention of the present application.

FIG. 10 is a cross-sectional view showing the vertical nitride semiconductor transistor device provided by the first embodiment of the second invention of the present application. A drift layer 601 is epitaxially grown on a substrate 600. The substrate 600 may adopt n-type GaN, SiC, Si, etc. In a case where the nitride semiconductor is epitaxially grown, good crystallinity may be obtained by growing the nitride semiconductor in the c-axis direction. Therefore, the substrate 600 is preferably a single-crystal substrate having a crystal plane orientation that allows epitaxial growth in the c-axis direction. For example, in a case where a GaN substrate or a SiC substrate having a hexagonal crystal structure is used, a single-crystal substrate having the crystal plane orientation of the substrate in the c-axis direction is used. In a case where a GaN substrate is used, a substrate having a Ga surface on which epitaxial crystal growth is particularly easy used is preferably used. In a case where a Si substrate is used, if a substrate having a crystal plane orientation of (111) is used, epitaxial growth of the nitride semiconductor in the c-axis direction may be obtained. Between the substrate 600 and the drift layer 601, a buffer layer may be inserted for the objective of improving the crystallinity during epitaxial growth of the drift layer 601. The drift layer 601 may adopt n-type GaN, n-type AlGaN, or AlGaN with a composition gradient, or the like. A barrier layer 602, a first nitride semiconductor layer 604, and a second nitride semiconductor layer 605 are disposed at the upper part of the drift layer 601. The barrier layer 602 is provided for the objective of preventing the flow of conduction electrons, but a part of the barrier layer 602 is provided with an opening 603 that does not block the flow of conduction electrons. There are various methods for making the opening 603. For example, the barrier layer 602 may be formed on the entire surface of the drift layer 601, and a part of the opening 603 may be removed by wet etching or dry etching. Then, the first nitride semiconductor layer 604 and the second nitride semiconductor layer 605 are grown to fill the opening 603. In this case, for the barrier layer 602, p-type GaN, p-type AlGaN, a high-resistance nitride semiconductor doped with a dopant for forming deep trap energy levels, an insulating film, or a laminated structure thereof, etc. grown epitaxially on the drift layer 601 is used. Alternatively, after the drift layer 601 is grown, a p-type dopant may be selectively introduced to the surface part other than the opening by ion implantation and activated by subsequent heat treatment, thereby forming the barrier layer 602 including a p-type layer. Alternatively, after the drift layer 601, the barrier layer 602 containing a p-type nitride semiconductor, the first nitride semiconductor layer 604, and the second nitride semiconductor layer 605 are epitaxially grown sequentially, an n-type dopant is selectively ion-implanted into the opening 603 and activated by subsequent heat treatment, so that the barrier layer 602 of the opening 603 undergoes n-type inversion. The second nitride semiconductor layer 605 contains at least a nitride semiconductor having a band gap larger than at least a part of the nitride semiconductor of the first nitride semiconductor layer 604. For example, GaN is used as the first nitride semiconductor layer 604, and AlGaN is used as the second nitride semiconductor layer 605. Thus, a conduction layer 613 (represented by the thick dashed line in FIG. 10) and a conduction layer 614 (represented by the thin dashed line in FIG. 10) containing two-dimensional electron gas are formed at the first nitride semiconductor layer 604 side of the interface between the second nitride semiconductor layer 605 and the first nitride semiconductor layer 604. A channel region 617 is represented by a dashed ellipse in FIG. 10. To promote electron conduction from the channel region 617 to the drift layer 601 through the opening 603, the first nitride semiconductor layer 604 may be doped with an n-type dopant. The manufacturing process above is the same as the first embodiment of the first invention of the present application. Then, a field insulating film 616 is deposited on the second nitride semiconductor layer 605, and the field insulating film 616 of the gate electrode forming part is removed. Then, a fourth insulating film 606 is deposited, and a charge storage electrode 607 is formed thereon. At this point, as shown in FIG. 10, the charge storage electrode 607 is ideally formed by being also disposed on the part where the field insulating film 616 exists, so that the area of the upper part of the charge storage electrode is larger than the area of the lower part thereof. Then, a fifth insulating film 608 is deposited on the charge storage electrode 607. The periphery of the charge storage electrode 607 is covered with the fourth insulating film 606 and the fifth insulating film 608 to be in an electrically floating state. In the fourth insulating film and the fifth insulating film, a conventionally known insulator material, such as a silicon oxide film, a silicon nitride film, an aluminum oxide film, a zirconium oxide film, a hafnium oxide film, or a laminated film thereof, may be used. Moreover, as the charge storage electrode 607, in addition to a metal layer, polysilicon doped with a dopant may also be used. In this case, phosphorus, arsenic, boron, etc. may be used as the dopant. Then, a gate electrode 609 is formed on the fifth insulating film 608 to form a capacitor together with the charge storage electrode. A source electrode 611 is formed on the second nitride semiconductor layer 605 to obtain good electrical connection with low resistance with respect to the conduction layer 614. As the electrode material, a multilayer film formed by a Ti lower layer and an Al upper layer is used, for example. In addition, when a p-type nitride semiconductor is used in the barrier layer 602, a body electrode 610 may be provided in order to fix the potential. Pd, Pt, or Ni is used as the electrode material, for example. The source electrode 611 is formed to be in electrical contact with the body electrode 610 at the same time. A drain electrode 612 is formed at the back surface of the substrate 600. The body electrode 610 and the source electrode 611 may be formed before the gate electrode 609 is formed. For example, after the second nitride semiconductor layer 605 is grown, the body electrode 610 is formed first, then the field insulating film 616 is deposited, the part of the field insulating film 616 used to form the source electrode is removed, and the source electrode 611 is formed. Then, the part of the field insulating film 616 used to form the gate electrode is removed, and then the gate part is manufactured until the gate electrode 609 is formed. The drain electrode 612 of the back surface may also be formed before other electrodes are formed.

Next, the working principle of the vertical nitride semiconductor transistor device provided by the first embodiment of the second invention of the present application is described. As in the first embodiment of the first invention of the present application, conduction electrons flowing out of the source electrode flow through the conduction layer 614 and the channel region 617 into the drift layer 601 through the opening 603 as shown by an arrow 615 indicating the flow of conduction electrons, and then reach the drain electrode 612 through the substrate 600. Moreover, the voltage applied to the gate electrode 609 is transmitted to the channel region 617 through the charge storage electrode 607 via capacitive coupling, so that the number of conduction electrons in the region may be changed. The gate voltage at which the number of conduction electrons in the channel region 617 becomes substantially zero so that the current flowing between the source electrode 611 and the drain electrode 612 is blocked is the threshold voltage, and its value may be changed according to the charges accumulated in the charge storage electrode 607. For example, when negative charges are accumulated in the charge storage electrode 607, the potential energy of the charge storage electrode 607 with respect to electrons is increased. As a result, the gate voltage dependence of drain current is shifted toward the positive gate voltage direction as a whole. If a sufficient amount of negative charge is provided, a normally-off action with a positive threshold voltage may be achieved.

Next, the method of accumulating negative charges on the charge storage electrode 607 in the first embodiment of the second invention of the present application is described. A voltage that is positive compared to the source electrode 611 may be applied to the gate electrode 609 so that electrons tunnel through the fourth insulating film 606 from the second nitride semiconductor layer 605 and are injected into the charge storage electrode 607. In this case, the thickness of the fourth insulating film 606 needs to be reduced in order to obtain sufficient tunneling current. But if too thin, the accumulated negative charges are released again due to tunneling. Generally, the thickness of the fourth insulating film 606 is set to a range of 5 nm to 20 nm. Moreover, to prevent the charges accumulated in the charge storage electrode 607 from being released again due to tunneling, the fifth insulating film 608 is made thicker. However, if too thick, the coupling capacitance between the gate electrode 609 and the charge storage electrode 607 is weakened, the change in the amount of conduction electrons in the channel region 617 caused by the gate voltage is smaller, and the amount of change in current is smaller, so the characteristics of the transistor are degraded. Generally, the thickness of the fifth insulating film 608 is set to a range of 10 nm to 40 nm.

As another method of accumulating negative charges in the charge storage electrode 607, a voltage that is negative compared to the source electrode 611 may be applied to the gate electrode 609, so that electrons tunnel through the fifth insulating film 608 from the gate electrode 609. In this case, the thickness of the fifth insulating film 608 is reduced to promote tunneling. Moreover, by designing the thickness and the like of the fourth insulating film 606 and the fifth insulating film 608, the outflow caused by the tunneling of electrons from the charge storage electrode 607 to the second nitride semiconductor layer 605 is dominant, and positive charges may also be accumulated in the charge storage electrode 607. Furthermore, the design may also make the outflow of electrons from the charge storage electrode 607 to the gate electrode 609 dominant when a voltage that is positive compared to the source electrode is also applied to the gate electrode 609, so that positive charges are accumulated in the charge storage electrode.

Figure 11:
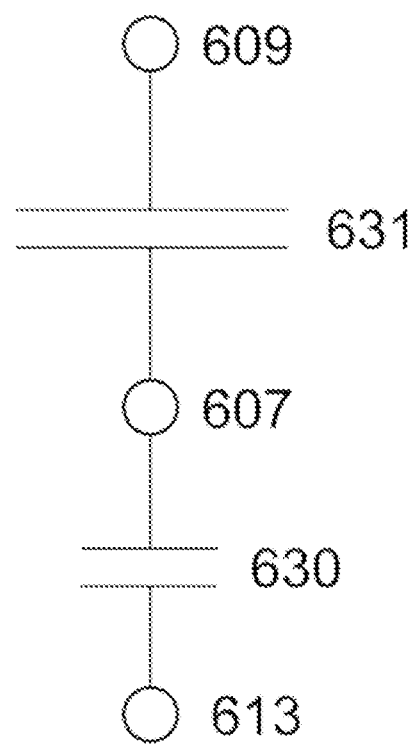
FIG. 11 is an equivalent circuit diagram showing capacitors between nodes of the vertical nitride semiconductor transistor device provided by the first embodiment of the second invention of the present application.

FIG. 11 is a diagram showing capacitors between nodes in the first embodiment of the second invention of the present application. A first capacitor 630 is a coupling capacitance between the conduction layer 613 and the charge storage electrode 607. The conduction layer 613 forms the channel region 617, and the number of conduction electrons is changed according to the voltage applied to the gate electrode 609. When conduction electrons are accumulated in the conduction layer 613, that is, when the switch is in the on state, and when the conduction electrons of the conduction layer 613 are exhausted and the switch is in the off state, the capacitance value of the first capacitor 630 of FIG. 11 is different, being large in the on state and small in the off state. Moreover, a second capacitor 631 is a coupling capacitance between the charge storage electrode 607 and the gate electrode 609. Here, the case where the switch is in the on state is described. In the on state, the value of the first capacitor 630 is larger, but it is desirable to make the value of the second capacitor 631 even larger. Thereby, the dependence of the number of conduction electrons induced in the channel region 617 on the voltage applied to the gate electrode 609, that is, the gate voltage, may be increased. In the first embodiment of the second invention of the present application shown in FIG. 10, the charge storage electrode 607 is formed by being also disposed at the part where the field insulating film 616 exists, so that the area of the second capacitor 631 is larger than the area of the first capacitor 630. Therefore, even when insulating films of the same dielectric constant and thickness are used for the fourth insulating film 606 and the fifth insulating film 608, the second capacitor 631 may still be made larger than the first capacitor 630 in proportion to the area to obtain a transistor device with excellent characteristics as a switch. In addition, in order to make the second capacitor 631 larger than the first capacitor 630, the dielectric constant of the fifth insulating film 608 may be larger than that of the fourth insulating film 606.

Figure 12:
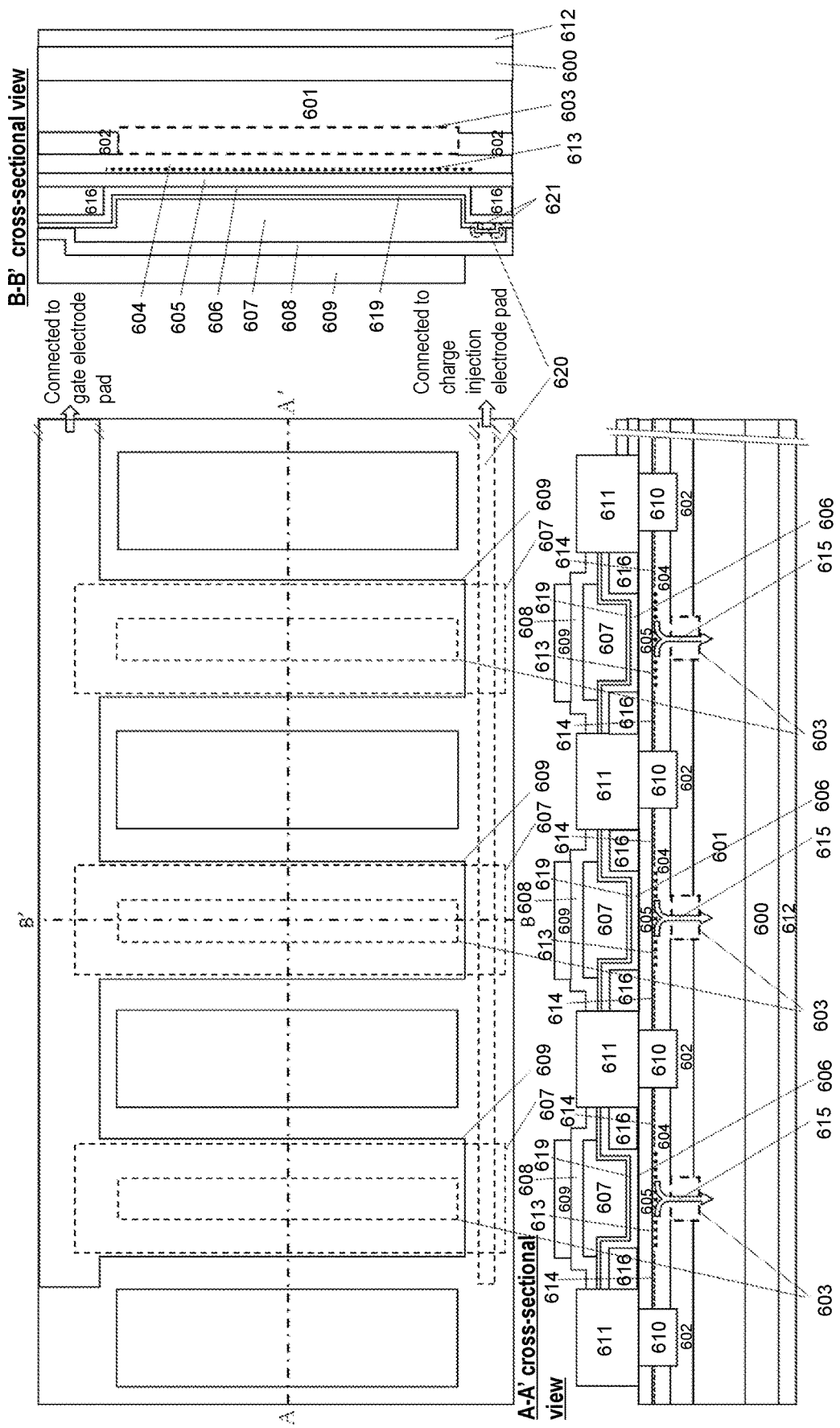
FIG. 12 is a plan view, an A-A' cross-sectional view, and a B-B' cross-sectional view showing the vertical nitride semiconductor transistor device provided by the second embodiment of the second invention of the present application.

FIG. 12 shows a cross-sectional view and a plan view of the vertical nitride semiconductor transistor device provided by the second embodiment of the second invention of the present application. The cross-sectional view shows both the A-A' cross-section and the B-B' cross-section. The difference from the first embodiment of the second invention of the present invention is that a charge injection electrode 620 capacitively coupled to the charge storage electrode 607 via an insulating film is provided. Hereinafter, this capacitor is referred to as a third capacitor 632. For example, as shown in the B-B' cross-sectional view of FIG. 12, the charge injection electrode 620 is formed at the lower part of the charge storage electrode 607 with a sixth insulating film 619 in between. In this case, the third capacitor 632 is formed by using the sixth insulating film 619 as a capacitive coupling film, and the first capacitor 630 is formed by using a laminated film of the fourth insulating film 606 and the sixth insulating film 619 as a capacitive coupling film. If the thickness of the sixth insulating film 619 is reduced, electrons are easily injected into the charge storage electrode 607 by tunneling through the third capacitor 632. Moreover, the thickness of the capacitive coupling film of the first capacitor 630 may be adjusted using the thickness of the fourth insulating film 606. When the charge injection electrode 620 and the third capacitor 632 are manufactured, variations may be considered. For example, the sixth insulating film may also be omitted. Instead, the charge injection electrode 620 is formed on the field insulating film 616, and a fourth insulating film is formed thereon, so that both the first capacitor 630 and the third capacitor 632 are manufactured by using the fourth insulating film as a capacitive coupling film. In this case, the thickness of the capacitive coupling film of the third capacitor 632 is thicker. However, the third capacitor 632 may have an edge 621 as shown in the figure, and the tunneling between the two electrodes is promoted by the concentration of the electric field at the edge. Therefore, electrons are injected relatively easily. Alternatively, the charge injection electrode 620 may be formed at the upper part of the charge storage electrode 607. In this case, for example, if after the charge storage electrode 607 is formed, the sixth insulating film 619 is formed at the upper part thereof and then the charge injection electrode 620 is formed thereon, the third capacitor 632 for which the sixth insulating film 619 is used as the capacitive coupling film may be obtained. Then, the fifth insulating film 608 is formed, and the gate electrode 609 is formed thereon. When the part of the sixth insulating film where the gate electrode 609 is formed is kept, a laminated film of the fifth insulating film 608 and the sixth insulating film 619 is used as the capacitive coupling film for the second capacitor 631. Alternatively, the fifth insulating film 608 may be formed after the part of the sixth insulating film 619 used to form the gate electrode 609 is removed, and the gate electrode 609 may be formed thereon. In this case, in the second capacitor 631, only the fifth insulating film 608 is used as the capacitive coupling film. In either method, the types and thicknesses of the capacitive coupling films of the first capacitor 630, the second capacitor 631, and the third capacitor 632 are all optimized according to the respective applications. For example, the thickness of the capacitive coupling film of the third capacitor 632 facilitates charge injection through tunneling. In the case of not taking advantage of the tunneling enhancement resulting from the electric field concentration of the edge, generally, the thickness of the insulating film is set to a range of 5 nm to 20 nm. Moreover, the thicknesses of the capacitive coupling films of the first capacitor 630 and the second capacitor 631 are preferably relatively larger, and are usually set in the range of 10 nm to 40 nm. Moreover, when the charge injection electrode 620 is also formed at the upper part of the charge storage electrode 607, if the charge injection electrode 620 is formed to cover the edge such as the end of the upper surface of the charge storage electrode 607, the tunneling enhancing effect of the edge may be used.

In FIG. 12, the charge storage electrode 607 is a separate finger-shaped object, and the entire transistor device preferably includes a plurality of separate charge storage electrodes 607. Therefore, even in a case where the charges accumulated in the electric charge storage electrode 607 are leaked due to local defect or damage and the threshold voltage is changed, the resulting affected area still stays in the individual charge storage electrode 607. Therefore, as a switching element as a whole, the increase in drain leakage current in the off state may be suppressed as much as possible. In FIG. 12, each finger-shaped object includes one charge storage electrode 607, but each finger-shaped object may also be further classified to include a plurality of charge storage electrodes 607. Moreover, regarding the pad used to supply voltage and current to the charge injection electrode 620, a common pad may be provided for all the charge injection electrodes 620, or the charge injection electrodes 620 may be separately connected to a plurality of pads.

Figure 13:
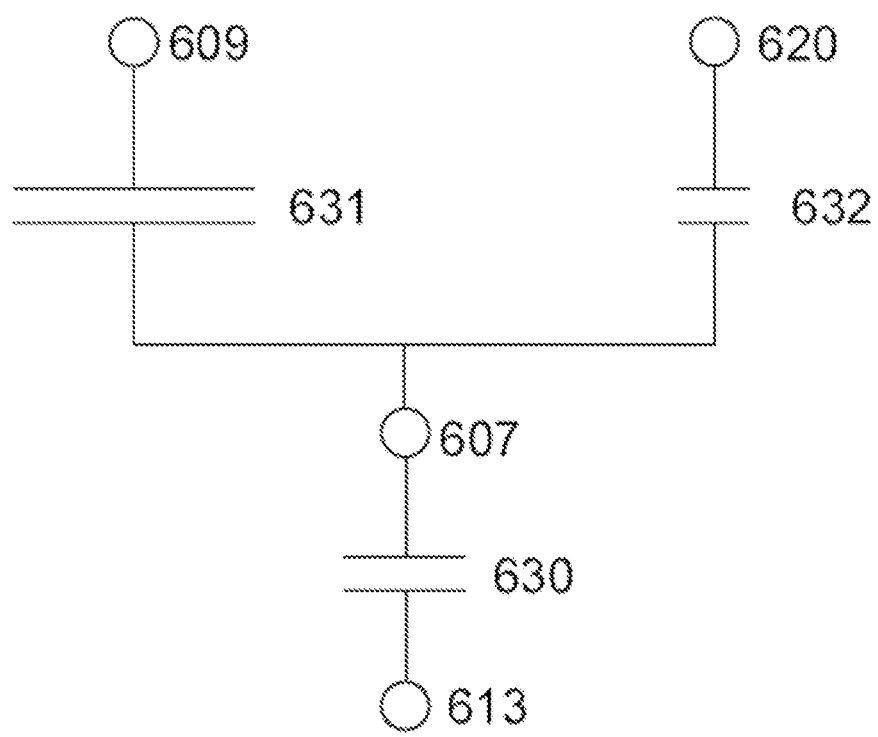
FIG. 13 is an equivalent circuit diagram showing capacitors between nodes of the vertical nitride semiconductor transistor device provided by the second embodiment of the second invention of the present application.

FIG. 13 shows an equivalent circuit of capacitors between nodes in the second embodiment of the second invention of the present application. In the equivalent circuit of the capacitors between nodes in the present embodiment, the third capacitor 632 is added to the first embodiment of the second invention of the present application shown in FIG. 11. In order to improve the characteristics of the switch in the on state, ideally, the capacitor 631 is larger than the capacitor 630 when the switch is on. In this regard, for example, the area of the capacitor 631 is preferably larger than the area of the capacitor 630, which is the same as the first embodiment of the second invention of the present application. For example, as shown in the A-A' cross-sectional view and B-B' cross-sectional view of FIG. 12, by forming the charge storage electrode 607 disposed also at the part where the field insulating film 616 exists, the area of the second capacitor 631 formed between the charge storage electrode 607 and the gate electrode 609 may be larger than the area of the first capacitor 630 formed between the charge storage electrode 607 and the conduction layer 613. Therefore, even if the dielectric films used for the first capacitor 630 and the second capacitor 631 have the same dielectric constant and thickness, the capacitance value of the second capacitor 631 may still be large.

Next, the capacitance value of the third capacitor 632 shown in FIG. 13 is described in conjunction with the method of accumulating charges in the charge storage electrode 607. In the second embodiment of the second invention of the present application, negative charges are accumulated in the charge storage electrode 607 by applying a voltage that is negative compared to the gate electrode 609 to the charge injection electrode 620. At this point, since the charge storage electrode 607 is capacitively coupled to the gate electrode 609 through the second capacitor 631, a voltage is applied to the third capacitor 632 between the charge injection electrode 620 and the charge storage electrode 607, and electrons from the charge injection electrode 620 tunnel through the capacitive coupling film and flow into the charge storage electrode 607. When positive charges are to be stored in the charge storage electrode 607, if a voltage that is positive compared to the gate electrode 609 is applied to the charge injection electrode 620, electrons flow out from the charge storage electrode 607 to the charge injection electrode 620 by tunneling through the capacitive coupling film of the third capacitor 632. As a result, the positive charges are accumulated in the charge storage electrode 607. In any method, the charges are all accumulated in the charge storage electrode 607 by a current flowing through the third capacitor 632. Here, the case where negative charges are accumulated in the charge storage electrode 607 is described in more detail. When a voltage that is negative compared to the gate electrode 609 is applied to the charge injection electrode 620, by making the capacitance value of the second capacitor 631 larger than the capacitance value of the third capacitor 632, the capacitive coupling between the gate electrode 609 and the charge storage electrode 607 is stronger, and a larger voltage is applied to the third capacitor 632 between the charge injection electrode 620 and the charge storage electrode 607. Therefore, the inflow of electrons from the charge injection electrode 620 to the charge storage electrode 607 by tunneling may be promoted. The charges may be accumulated in the charge storage electrode 607 by fixing the potential of the source electrode. For example, the source electrode 611 is grounded together with the gate electrode 609, and a negative voltage is applied to the charge injection electrode 620. The threshold voltage of the transistor before the negative charges are accumulated is usually a negative value, and the transistor is in the on state. Therefore, the capacitance value of the first capacitor 630 is large. Therefore, the potential of the charge storage electrode 607 is strongly fixed by the capacitive coupling between the second capacitor 631 and the first capacitor 630. Therefore, most of the voltage applied to the charge injection electrode 620 is applied to the third capacitor 632, thus promoting the injection of electrons into the charge storage electrode 607 through tunneling.

Figure 14:
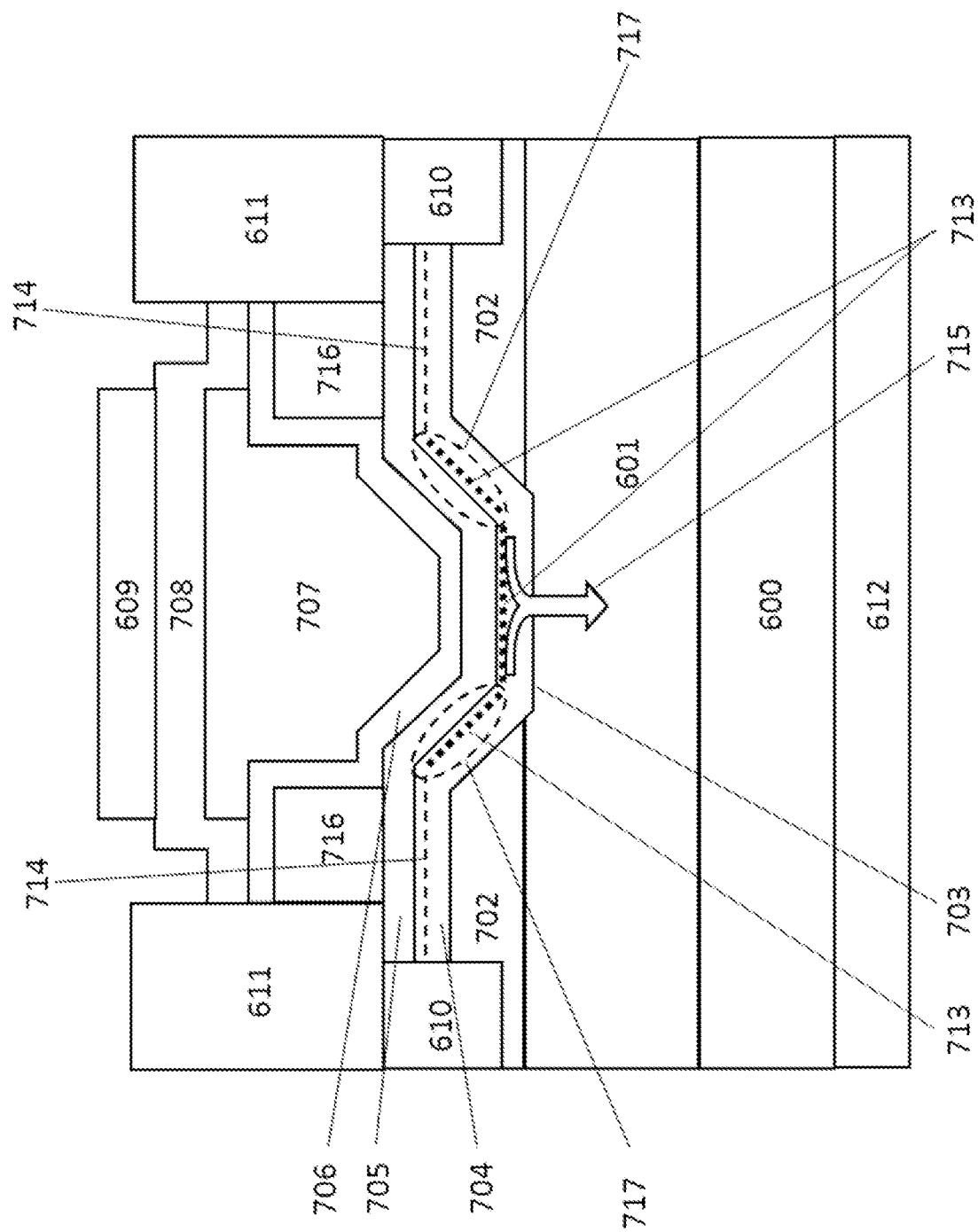
FIG. 14 is a cross-sectional view showing the vertical nitride semiconductor transistor device provided by the third embodiment of the second invention of the present application.

FIG. 14 is a cross-sectional view showing the vertical nitride semiconductor transistor device provided by the third embodiment of the second invention of the present application. In the present embodiment, a p-type nitride semiconductor layer or a high-resistance nitride semiconductor layer grown on the drift layer 601 is used as a barrier layer 702, and an opening 703 having an incline is formed by etching. Then, a first nitride semiconductor layer 704 and a second nitride semiconductor layer 705 are grown at the upper surface of the opening 703 containing an inclined part, and then a field insulating film 716 is deposited on the second nitride semiconductor layer 705, and the field insulating film 716 of the gate electrode forming part is removed. Then, a fourth insulating film 706 is deposited, and a charge storage electrode 707 is formed thereon. At this point, the charge storage electrode 707 is ideally formed by being also disposed at the part where the field insulating film 716 exists, so that the area of the upper part of the charge storage electrode 707 is enlarged. Then, a fifth insulating film 708 is deposited on the charge storage electrode 707. The rest is the same as the first embodiment of the second invention of the present application. In the present embodiment, at least a part of a conduction layer 713 is formed at the inclined part of the opening 703. The conduction layer 713 of the inclined part forms a channel region 717, and conduction electrons flowing out of the source electrode flow through a conduction layer 714 and the channel region 717 into the drift layer 601 along an arrow 715 indicating the flow of conduction electrons. As described in the third current approach, when the crystal plane orientation of the nitride semiconductor layered structure deviates from the c-axis direction, the resulting polarization is weakened. Therefore, when comparing before charges are accumulated in the charge storage electrode, the threshold voltage for substantially eliminating the conduction electrons in the channel region 717 to block the current between the source electrode 611 and the drain electrode 612 is a negative voltage smaller than that of the first embodiment of the second invention of the present application. Therefore, the amount of negative charges that needs to be stored in the charge storage electrode 707 in order to obtain desired normally-off characteristic may be reduced. The method of accumulating negative and positive charges in the charge storage electrode 707 may be the same as the first embodiment of the second invention of the present application. Alternatively, in the case of using a current injection electrode as in the second embodiment of the second invention of the present application, the same method as described in the previous paragraph may be used.

Figure 15:
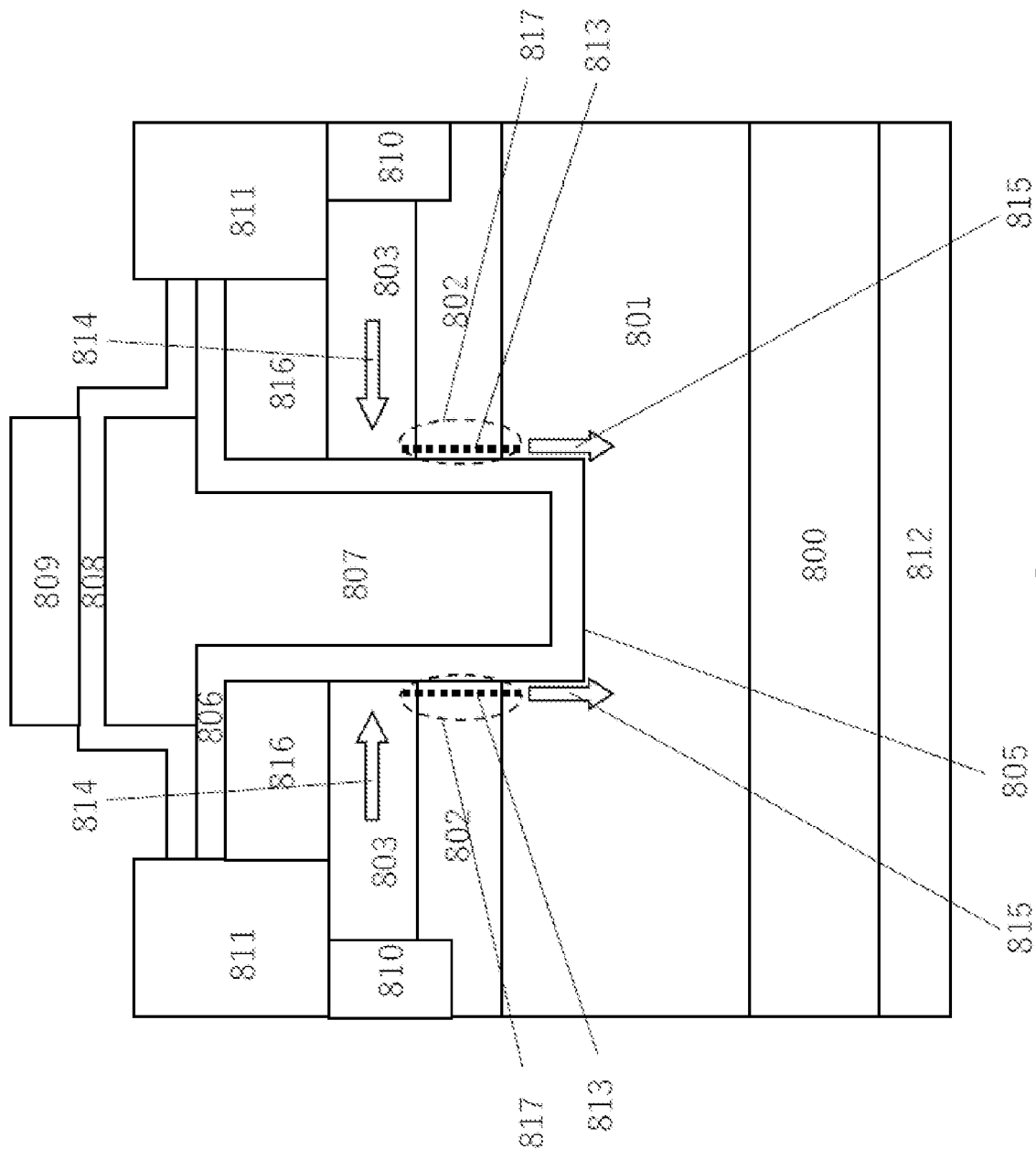
FIG. 15 is a cross-sectional view showing the vertical nitride semiconductor transistor device provided by the fourth embodiment of the second invention of the present application.

FIG. 15 is a cross-sectional view showing the vertical nitride semiconductor transistor device provided by the fourth embodiment of the second invention of the present application. A drift layer 801, a third nitride semiconductor layer 802 having p-type conductivity, and a fourth nitride semiconductor layer 803 having n-type conductivity are sequentially grown on a substrate 800. Up to this point, the details are the same as the fourth embodiment of the first invention of the present application. Then, after a field insulating film 816 is deposited and an opening is formed at the gate electrode forming part, the opening is used as a mask to form a trench 805 that penetrates the fourth nitride semiconductor layer 803 and the third nitride semiconductor layer 802 and reaches the drift layer 801. Then, a fourth insulating film 806 is formed to cover the inside of the trench 805. For the objective of improving the characteristics of the interface between the insulating films and the nitride semiconductors, the fourth insulating film 806 may be formed after a thin nitride semiconductor layer such as a GaN layer is grown inside the trench 805. Furthermore, a charge storage electrode 807 is formed inside the trench 803, a fifth insulating film 808 is further formed, and a gate electrode 809 is formed thereon. A body electrode 810 is arranged to be in electrical contact with the third nitride semiconductor layer 802, and the source electrode is arranged to be in electrical contact with the fourth nitride semiconductor layer 803 and the body electrode 810. In addition, a drain electrode is provided to be in electrical contact with the substrate 800 from the back surface. In addition, as explained in the first embodiment of the second invention of the present application, the body electrode 810 and a source electrode 811 may be formed before the gate electrode 809 is formed. The materials of the fourth insulating film 806, the fifth insulating film 808, and the charge storage electrode 807 are also the same as those of the first embodiment of the second invention of the present application.

In the vertical nitride semiconductor transistor device provided by the fourth embodiment of the second invention of the present application shown in FIG. 15, similar to the fourth embodiment of the first invention of the present application, conduction electrons flowing out from the source electrode 811 flow in the trench direction along an arrow 814 indicating the flow of conduction electrons in the fourth nitride semiconductor layer 803, then flow into the drift layer 801 in the direction of an arrow 815 indicating the flow of conduction electrons through a channel region 817 including an inverted conduction layer 813, and then reach a drain electrode 812 through the substrate 800. Moreover, in the fourth embodiment of the second invention of the present application shown in FIG. 15, by accumulating charges in the charge storage electrode 807, the threshold voltage for substantially eliminating conduction electrons of the channel region 817 to block the current between the source electrode 811 and the drain electrode 812 may be adjusted. In particular, negative charges may be accumulated in the charge storage electrode 807 to make the threshold voltage a positive value. Alternatively, in the case where the threshold voltage before the charges are accumulated is already a positive value, the threshold voltage may also be adjusted to the desired value by accumulating negative or positive charges. Alternatively, the accumulated charges may be adjusted for each transistor to reduce threshold voltage variation.

The accumulation of negative charges in the charge storage electrode 807 may be accomplished by electrons flowing from the conduction layer 813, the fourth nitride semiconductor layer 803, or the drift layer 801 through the fourth insulating film 806 by tunneling to the charge storage electrode 807. And this may be achieved by applying a voltage that is positive with respect to the source electrode 811 to the gate electrode 809. If the fifth insulating film 808 is sufficiently thin, electrons may flow from the gate electrode 809 into the charge storage electrode 807 by tunneling through the fifth insulating film 808, thereby accumulating negative charges in the charge storage electrode 807. And this may be achieved by applying a voltage that is negative with respect to the source electrode 811 to the gate electrode 809. Moreover, the accumulation of positive charges in the charge storage electrode 807 may be performed in the following manner: by designing the thicknesses of the fourth insulating film 806 and the fifth insulating film 808, when a negative voltage compared to the source electrode 811 is applied to the gate electrode 809, the tunneling of electrons from the charge storage electrode 807 to the third nitride semiconductor layer 802 or the tunneling of electron holes from the third nitride semiconductor layer 802 to the charge storage electrode 807 is dominant. Alternatively, the following method may be used: by designing the thicknesses of the fourth insulating film 806 and the fifth insulating film 808, when a positive voltage compared to the source electrode 811 is applied to the gate electrode 809, the tunneling of electrons from the charge storage electrode 807 to the gate electrode 809 is dominant.

As another method of accumulating charges in the charge storage electrode 807, a charge injection electrode may be provided as in the second embodiment of the second invention of the present application, and the same method as described in the previous paragraph may be used.

As in the case of the first and second embodiments of the second invention of the present application, as shown in FIG. 15, the charge storage electrode 807 is formed by being also disposed at the part where the field insulating film 816 exists, thereby increasing the area of the capacitor formed between the charge storage electrode 807 and the gate electrode 809 to help improve the characteristics of the transistor as a switch.

Figure 16:
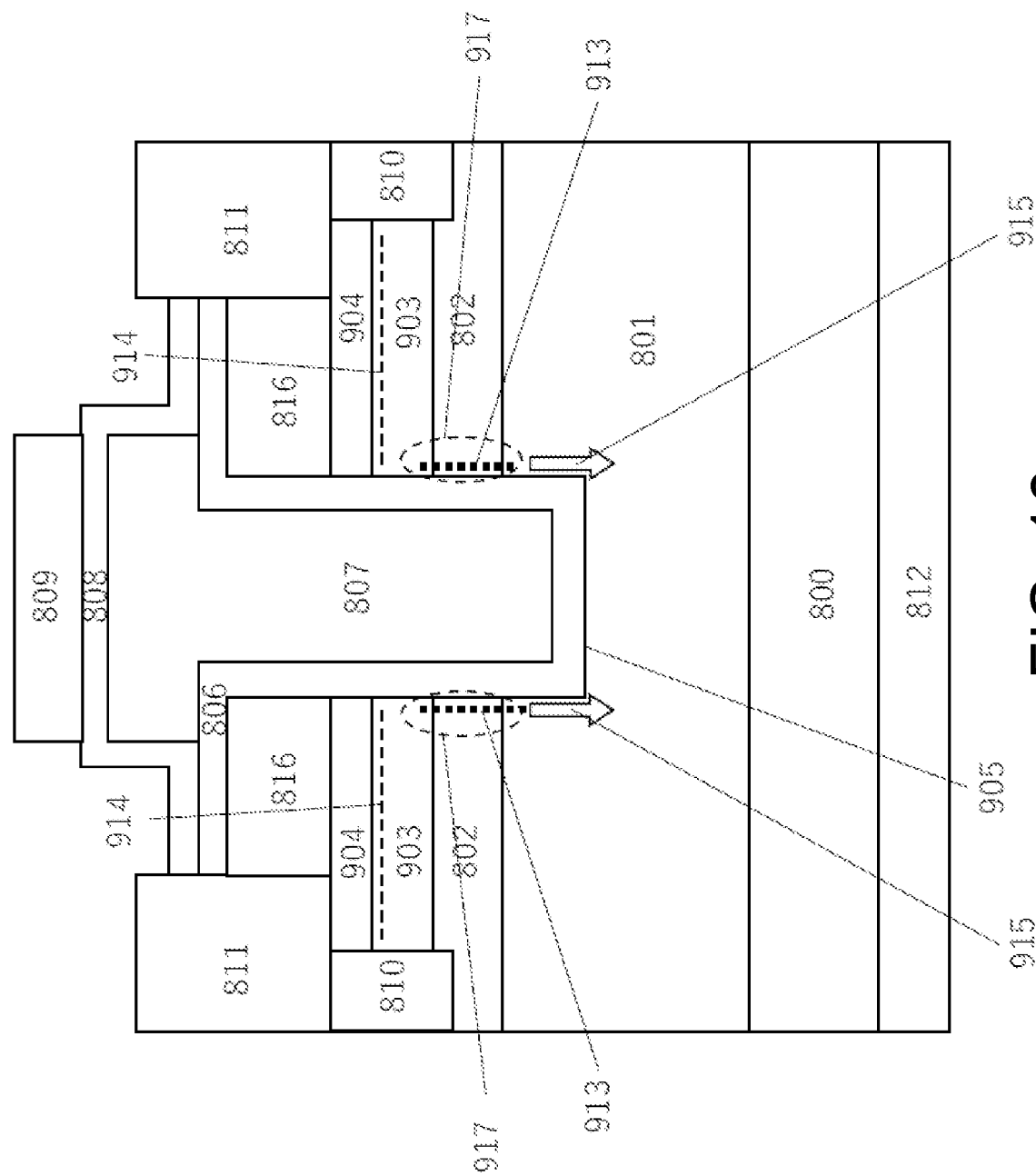
FIG. 16 is a cross-sectional view showing the vertical nitride semiconductor transistor device provided by the fifth embodiment of the second invention of the present application.

FIG. 16 is a cross-sectional view showing the vertical nitride semiconductor transistor device provided by the fifth embodiment of the second invention of the present application. The difference between the present embodiment and the fourth embodiment of the second invention of the present application is: after the p-type third nitride semiconductor layer 802 is grown, as a layer corresponding to the fourth nitride semiconductor layer, a nitride semiconductor layer formed by a first nitride semiconductor layer 903 and a second nitride semiconductor layer 904 is formed. Here, similar to the first embodiment of the second invention of the present application, the second nitride semiconductor layer 904 contains at least a nitride semiconductor having a band gap larger than at least a part of the nitride semiconductor of the first nitride semiconductor layer 903. For example, GaN is used as the first nitride semiconductor layer 903, and AlGaN is used as the second nitride semiconductor layer 904. Thus, a conduction layer 914 containing two-dimensional electron gas is formed at the first nitride semiconductor layer 903 side of the interface between the second nitride semiconductor layer 904 and the first nitride semiconductor layer 903. A nitride semiconductor layer formed by the first nitride semiconductor layer 903 and the second nitride semiconductor layer 904 may still induce conduction electrons in the conduction layer 914 using the charge polarization effect even if an n-type dopant is not doped. Therefore, n-type conductivity may be substantially obtained, but in order to promote electron current toward a channel region 917 including an inverted conduction layer 913, the first nitride semiconductor layer 903 may be doped with an n-type dopant. In the transistor of the present embodiment, conduction electrons flowing out of the source electrode 811 flow into the drift layer 801 through the conduction layer 914 and the channel region 917 in the direction of an arrow 915 indicating the flow of conduction electrons.

In the embodiments above, the case where GaN and AlGaN are used as the nitride semiconductor is described, but other nitride semiconductors, for example, nitride semiconductors containing In such as InN, InGaN, and InAlN, may also be used. Alternatively, a laminated structure of nitride semiconductors with different materials or compositions may also be used. Especially in the first, second, third, and fifth embodiments of the first invention of the present application and the first, second, third, and fifth embodiments of the second invention of the present application, materials and compositions may be selected in a way that the main part of the first nitride semiconductor layer is formed by a nitride semiconductor having a small band gap and the main part of the second nitride semiconductor layer is formed by a nitride semiconductor having a large band gap.

In the first, second, third, and fifth embodiments of the first invention of the present application and the first, second, third, and fifth embodiments of the second invention of the present application, for example, the first nitride semiconductor layer may be GaN, and the second nitride semiconductor layer may be a two-layer structure with AlGaN as the lower layer and GaN as the upper layer. AlGaN has a larger band gap than a GaN first nitride semiconductor, and functions as the main part, while the GaN upper layer is used as a protective film to prevent Al atoms that are easily oxidized from being exposed to the surface.

INDUSTRIAL APPLICABILITY

The vertical nitride semiconductor transistor device of the invention may be effectively used mainly as a power switch for power circuits and the like. In addition, the threshold voltage adjustment method provided by the invention may achieve the desired normally-off action as a switch.

What is claimed is:

1. A vertical nitride semiconductor transistor device, comprising:
   a nitride semiconductor drift layer;
   a nitride semiconductor channel region electrically connected to the drift layer;
   a source electrode electrically contacting with a side of the channel region opposite to the drift layer;

a drain electrode in electrical contact with the drift layer;
a gate insulating film adjacent to the channel region; and
a gate electrode disposed at a side of the gate insulating film opposite to the channel region,
wherein the gate insulating film has a channel region side closer to the channel region and a gate electrode side closer to the gate electrode, and the gate insulating film comprises at least a first insulating film located at the channel region side, a second insulating film located closer to the gate electrode side than the first insulating film, and a third insulating film located closer to the gate electrode side than the second insulating film,
wherein the second insulating film has charge traps with energy levels located inside band gaps of both the first insulating film and the third insulating film, and
wherein a threshold voltage is adjusted by charges accumulated in the charge traps, and the threshold voltage is used to substantially eliminate conduction carriers of the channel region using a voltage applied to the gate electrode to block a current flowing between the source electrode and the drain electrode.

2. The vertical nitride semiconductor transistor device of claim 1, wherein the threshold voltage is adjusted to a positive value by the charges accumulated in the charge traps.

3. The vertical nitride semiconductor transistor device of claim 1, further comprising:
a barrier layer disposed on the drift layer for an object of preventing the current;
a first nitride semiconductor layer disposed on the barrier layer; and
a second nitride semiconductor layer disposed on the first nitride semiconductor layer,
wherein the second nitride semiconductor layer contains at least a nitride semiconductor having a band gap larger than at least a part of a nitride semiconductor of the first nitride semiconductor layer,
wherein a conduction layer is formed at a first nitride semiconductor layer side of an interface between the second nitride semiconductor layer and the first nitride semiconductor layer,
wherein the channel region comprises at least a part of the conduction layer,
the barrier layer has an opening,
the first nitride semiconductor layer is electrically connected to the drift layer through the opening, and
the current flowing between the source electrode and the drain electrode substantially flows through the opening.

4. The vertical nitride semiconductor transistor device of claim 3, wherein the first nitride semiconductor layer comprises at least a GaN layer, and the second nitride semiconductor layer comprises at least $Al_xGa_{1-x}N$, $0<x\leq 1$.

5. The vertical nitride semiconductor transistor device of claim 1, further comprising:
a third nitride semiconductor layer disposed on the drift layer and having a conductivity type opposite to that of the drift layer; and
a fourth nitride semiconductor layer disposed on the third nitride semiconductor layer and having substantially a same conductivity type as the drift layer through dopant doping or polarized charges,
wherein the source electrode is electrically connected to the fourth nitride semiconductor layer,
a trench that penetrates the fourth nitride semiconductor layer and the third nitride semiconductor layer to reach the drift layer is formed,
at least a part of the gate insulating film is formed at a side surface of the third nitride semiconductor layer in an inner surface of the trench directly or with a thin nitride semiconductor layer in between,
an inverted conduction layer is formed at a side of an interface formed directly between the side surface of the third nitride semiconductor layer and the gate insulating film or with the thin nitride semiconductor layer in between, and the side of the interface is closer to the third nitride semiconductor layer,
at least a part of the gate electrode is formed at a side of the gate insulating film opposite to the inverted conduction layer, and
the channel region comprises at least a part of the inverted conduction layer.

6. The vertical nitride semiconductor transistor device of claim 1, wherein the second insulating film comprises at least one film of silicon nitride, hafnium oxide, and zirconium oxide.

7. The vertical nitride semiconductor transistor device of claim 1, wherein the first insulating film and the third insulating film both comprise at least one film of silicon oxide and aluminum oxide.

8. A vertical nitride semiconductor transistor device, comprising:
a drift layer formed by a nitride semiconductor;
a channel region formed by a nitride semiconductor and electrically connected to the drift layer;
a source electrode electrically in contact with a side of the channel region opposite to the drift layer;
a drain electrode in electrical contact with the drift layer;
a fourth gate insulating film adjacent to the channel region;
a charge storage electrode disposed at a side of the fourth insulating film opposite to the channel region;
a fifth insulating film disposed at a side of the charge storage electrode opposite to the fourth insulating film; and
a gate electrode disposed at a side of the fifth insulating film opposite to the charge storage electrode,
wherein a threshold voltage is adjusted by charges accumulated in the charge storage electrode, and the threshold voltage is used to substantially eliminate conduction carriers of the channel region using a voltage applied to the gate electrode to block a current flowing between the source electrode and the drain electrode.

9. The vertical nitride semiconductor transistor device of claim 8, wherein the charge storage electrode comprises a plurality of electrodes arranged laterally and electrically insulated.

10. The vertical nitride semiconductor transistor device of claim 8, wherein the threshold voltage is adjusted to a positive voltage by the charges accumulated in the charge storage electrode.

11. The vertical nitride semiconductor transistor device of claim 8, wherein in an on state, a capacitance value of a first capacitor formed between the channel region and the charge storage electrode is smaller than a capacitance value of a second capacitor formed between the gate electrode and the charge storage electrode.

12. The vertical nitride semiconductor transistor device of claim 8, further comprising a charge injection electrode forming a third capacitor with the charge storage electrode, and the charges of the charge storage electrode are accumulated by a current flowing through the third capacitor.

13. The vertical nitride semiconductor transistor device of claim 12, further comprising a sixth insulating film on at least a part on the charge injection electrode, wherein the charge storage electrode is formed on at least a part on the sixth insulating film, and the sixth insulating film is used as a capacitive coupling film to form the third capacitor between the charge storage electrode and the charge injection electrode.

14. The vertical nitride semiconductor transistor device of claim 12, wherein a capacitance value of the third capacitor is smaller than a capacitance value of a second capacitor formed between the gate electrode and the charge storage electrode.

15. The vertical nitride semiconductor transistor device of claim 8, further comprising:
   a barrier layer disposed on the drift layer for blocking the current;
   a first nitride semiconductor layer disposed on the barrier layer; and
   a second nitride semiconductor layer disposed on the first nitride semiconductor layer,
   wherein the second nitride semiconductor layer contains at least a nitride semiconductor having a band gap larger than at least a part of a nitride semiconductor of the first nitride semiconductor layer,
   a conduction layer is formed at a first nitride semiconductor layer side of an interface between the second nitride semiconductor layer and the first nitride semiconductor layer,
   the channel region comprises at least a part of the conduction layer,
   the barrier layer has an opening,
   the first nitride semiconductor layer is electrically connected to the drift layer through the opening, and
   the current between the source electrode and the drain electrode substantially flows through the opening.

16. The vertical nitride semiconductor transistor device of claim 15, wherein the first nitride semiconductor layer comprises at least a GaN layer, and the second nitride semiconductor layer comprises at least $Al_xGa_{1-x}N$, $0<x\leq1$.

17. The vertical nitride semiconductor transistor device of claim 8, further comprising:
   a third nitride semiconductor layer disposed on the drift layer and having a conductivity type opposite to that of the drift layer; and
   a fourth nitride semiconductor layer disposed on the third nitride semiconductor layer and having substantially a same conductivity type as the drift layer through dopant doping or polarized charges,
   wherein the source electrode is electrically connected to the fourth nitride semiconductor layer,
   a trench that penetrates the fourth nitride semiconductor layer and the third nitride semiconductor layer to reach the drift layer is formed,
   at least a part of the fourth insulating film is formed at a side surface of the third nitride semiconductor layer in an inner surface of the trench directly or with a thin nitride semiconductor layer in between,
   an inverted conduction layer is formed at a side of an interface formed directly between the side surface of the third nitride semiconductor layer and the fourth insulating film or with the thin nitride semiconductor layer in between, and the side of the interface is closer to the third nitride semiconductor layer,
   at least a part of the charge storage electrode is formed at a side of the fourth insulating film opposite to the inverted conduction layer, and
   the channel region comprises at least a part of the inverted conduction layer.

18. The vertical nitride semiconductor transistor device of claim 8, wherein the fourth insulating film and the fifth insulating film both comprise at least one film of silicon oxide and aluminum oxide.

19. The vertical nitride semiconductor transistor device of claim 12, wherein the gate electrode, the source electrode, and the drain electrode are independently connected to an external pin of a package, and the charge injection electrode is not connected to the external pin of the package.

20. The vertical nitride semiconductor transistor device of claim 12, wherein the charge injection electrode and the gate electrode are connected to a same external pin of a package.

* * * * *